US011283150B2

(12) United States Patent
Arai

(10) Patent No.: US 11,283,150 B2
(45) Date of Patent: Mar. 22, 2022

(54) ANTENNA MODULE

(71) Applicant: Murata Manufacturing Co., Ltd., Kyoto (JP)

(72) Inventor: Kota Arai, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 10 days.

(21) Appl. No.: 16/803,592

(22) Filed: Feb. 27, 2020

(65) Prior Publication Data

US 2020/0194869 A1    Jun. 18, 2020

Related U.S. Application Data

(63) Continuation of application No. PCT/JP2018/027601, filed on Jul. 24, 2018.

(30) Foreign Application Priority Data

Aug. 30, 2017    (JP) .............................. JP2017-164897

(51) Int. Cl.
*H01Q 21/06* (2006.01)
*H01Q 1/22* (2006.01)
(Continued)

(52) U.S. Cl.
CPC .............. *H01Q 1/2208* (2013.01); *H01Q 1/38* (2013.01); *H01Q 1/46* (2013.01); *H01Q 21/0025* (2013.01)

(58) Field of Classification Search
CPC .......... H01Q 1/2208; H01Q 1/38; H01Q 1/46; H01Q 21/0025; H01Q 1/2283;
(Continued)

(56) References Cited

U.S. PATENT DOCUMENTS 10,468,763 B2    11/2019 Yokoyama et al.
2012/0280860 A1*  11/2012 Kamgaing ............... H01Q 3/30
                                                342/368
(Continued)

FOREIGN PATENT DOCUMENTS

CN        102509901 A      6/2012
CN        105612659 A      5/2016
(Continued)

OTHER PUBLICATIONS

International Search Report for International Application No. PCT/JP2018/027601 dated Oct. 23, 2018.
(Continued)

*Primary Examiner* — David E Lotter
(74) *Attorney, Agent, or Firm* — Pearne & Gordon LLP

(57) ABSTRACT

An antenna module includes a dielectric substrate, a plurality of antenna elements, and an RFIC having a plurality of power supply terminals configured to supply power to each of the plurality of antenna elements via a power supply line. The plurality of antenna elements include a first antenna element and a second antenna element disposed along a first direction connecting two points within a region, the first antenna element is located on the side of a center of the region relative to the second antenna element, and the number of antenna elements to which power is supplied by a power supply line for supplying power to the first antenna element is smaller than the number of antenna elements to which power is supplied by a power supply line for supplying power to the second antenna element.

20 Claims, 20 Drawing Sheets

(51) Int. Cl.
*H01Q 1/38* (2006.01)
*H01Q 1/46* (2006.01)
*H01Q 21/00* (2006.01)

(58) Field of Classification Search
CPC ........ H01Q 21/065; H01Q 3/28; H01P 1/047; H05K 1/02; H05K 3/46
See application file for complete search history.

(56) References Cited

U.S. PATENT DOCUMENTS

2014/0375518 A1   12/2014  Powell et al.
2015/0200455 A1*  7/2015  Venkateswaran ........ H01Q 3/36
                                            342/372

FOREIGN PATENT DOCUMENTS

| JP | S62203403 A | 9/1987 |
| JP | H07046023 A | 2/1995 |
| JP | 2000312063 A | 11/2000 |
| JP | 2011210930 A | 10/2011 |
| JP | 2015533030 A | 11/2015 |
| WO | 2016067969 A1 | 5/2016 |
| WO | 2017119222 A1 | 7/2017 |

OTHER PUBLICATIONS

Written Opinion for International Application No. PCT/JP2018/027601 dated Oct. 23, 2018.
Ju Xinde; Zhao Yu Jun, "Shaped Base Station Antenna Integrated with Unequal Amplitude and Unequal Phase Linear Arrays", Practical Antenna Engineering Technology, Apr. 2015, pp. 143-151, ISBN: 978-7-5606-3387-9, Xidian University Press.
Office Action for Chinese Patent Application No. 201880056609.7 dated May 18, 2021.

* cited by examiner

ANTENNA MODULE

This is a continuation of International Application No. PCT/JP2018/027601 filed on Jul. 24, 2018 which claims priority from Japanese Patent Application No. 2017-164897 filed on Aug. 30, 2017. The contents of these applications are incorporated herein by reference in their entireties.

BACKGROUND

Technical Field

The present disclosure relates to antenna modules.

There is disclosed an antenna module for wireless communication including a dielectric substrate, a plurality of antenna elements disposed on the dielectric substrate and two-dimensionally arranged, and a radio frequency circuit element disposed on the dielectric substrate and having a plurality of power supply terminals for supplying power to the plurality of antenna elements (see, for example, Patent Document 1).

Patent Document 1: International Publication No. WO 2016/067969

BRIEF SUMMARY

In the antenna module as disclosed in Patent Document 1, antenna elements of the same number are usually connected to each of the power supply terminals, so that the power supplied to each antenna element becomes uniform. However, in this case, there is a problem in that side lobes are worsened.

The present disclosure provides an antenna module able to suppress the side lobes.

An antenna module according to an aspect of the present disclosure includes a dielectric substrate, a plurality of antenna elements disposed on the dielectric substrate and two-dimensionally arranged, and a radio frequency circuit element disposed on the dielectric substrate and having a plurality of power supply terminals configured to supply power to each of the plurality of antenna elements via a power supply line. The plurality of antenna elements include a first antenna element and a second antenna element disposed along a first direction connecting two points within a region containing all the plurality of antenna elements in a plan view of the dielectric substrate. The first antenna element is located on a center side of the above-mentioned region relative to the second antenna element. The total number of antenna elements to which power is supplied by a power supply line for supplying power to the first antenna element is smaller than the total number of antenna elements to which power is supplied by a power supply line for supplying power to the second antenna element.

According to this aspect, the power supplied to the second antenna element located on an end portion side of the region containing all the plurality of antenna elements becomes smaller than the power supplied to the first antenna element located on the center side of the above region, thereby making it possible to suppress side lobes in the first direction. Further, the total number of antenna elements to which power is supplied by a certain power supply line differs from the total number of antenna elements to which power is supplied by another power supply line, and it is unnecessary to uniform the total number of antenna elements to be connected to each power supply line, whereby it is possible to flexibly design the number of antenna elements, and an interval between the antenna elements.

The plurality of antenna elements may include a plurality of antenna element groups each constituted of one antenna element or two or more antenna elements connected to each other, the plurality of antenna element groups may not be electrically connected to each other, the plurality of power supply terminals may respectively be connected to different antenna element groups, and the number of antenna elements constituting the antenna element group including the first antenna element may be smaller than the number of antenna elements constituting the antenna element group including the second antenna element.

According to this configuration, the power supplied to the antenna element group including the second antenna element becomes smaller than the power supplied to the antenna element group including the first antenna element, thereby making it possible to suppress side lobes in the first direction.

The plurality of antenna element groups may be disposed along the first direction, and the total number of antenna elements constituting each of the antenna element groups disposed on an end portion side relative to the center of the above-mentioned region among the plurality of antenna element groups may be equal to or larger than the total number of antenna elements constituting the antenna element group disposed on the center side, or equal to or smaller than the total number of antenna elements constituting the antenna element group disposed on the end portion side.

According to this configuration, the total number of antenna elements constituting each of the plurality of antenna element groups disposed along the first direction is kept equal or becomes larger as a distance from the center of the region containing all the plurality of antenna elements comes close toward the end portion thereof. That is, since the total number of antenna elements constituting the antenna element group does not decrease from the center of the above region toward the end portion thereof, it is possible to more effectively suppress the side lobes in the first direction.

The plurality of antenna element groups may include a plurality of antenna element groups in column form, in each of which the plurality of antenna elements connected to each other are arranged along a direction perpendicular to the first direction in the plan view; and the total number of antenna elements constituting each of the antenna element groups in the column form disposed on the end portion side relative to the center among the plurality of antenna element groups may be equal to or larger than the total number of antenna elements constituting the antenna element group in the column form disposed on the center side, or equal to or smaller than the total number of antenna elements constituting the antenna element group in the column form disposed on the end portion side.

According to this configuration, the total number of antenna elements constituting each of the plurality of antenna element groups in the column form disposed along the first direction is kept equal or becomes larger as coming close toward the end portion of the region containing all the plurality of antenna elements. Accordingly, since the total number of antenna elements constituting the antenna element group for each column does not decrease from the center of the region toward the end portion thereof, it is possible to more effectively suppress the side lobes in the first direction.

The plurality of antenna elements may include a third antenna element and a fourth antenna element disposed along the first direction; the first antenna element, the second antenna element, the third antenna element, and the fourth antenna element may be aligned in the order of the fourth antenna element, the third antenna element, the center, the first antenna element, and the second antenna element; and the total number of antenna elements to which power is supplied by a power supply line for supplying power to the third antenna element may be smaller than the total number of antenna elements to which power is supplied by a power supply line for supplying power to the fourth antenna element.

According to this configuration, the power supplied to the fourth antenna element located on the end portion side of the region containing all the plurality of antenna elements becomes smaller than the power supplied to the third antenna element located on the center side of the above region, thereby making it possible to suppress the side lobes more effectively in the first direction. Specifically, the side lobes on both sides with respect to the center of the region containing all the plurality of antenna elements (for example, the center of the dielectric substrate) can be suppressed.

Further, the plurality of antenna elements may include a fifth antenna element and a sixth antenna element disposed along a second direction perpendicular to the first direction in the plan view, the fifth antenna element may be located on the center side relative to the sixth antenna element, and the total number of antenna elements to which power is supplied by a power supply line for supplying power to the fifth antenna element may be smaller than the total number of antenna elements to which power is supplied by a power supply line for supplying power to the sixth antenna element.

According to this configuration, the power supplied to the sixth antenna element located on the end portion side of the region containing all the plurality of antenna elements becomes smaller than the power supplied to the fifth antenna element located on the center side of the above region, thereby making it also possible to suppress side lobes in the second direction perpendicular to the first direction.

The plurality of antenna elements may include a seventh antenna element and an eighth antenna element disposed along the second direction; the fifth antenna element, the sixth antenna element, the seventh antenna element, and the eighth antenna element may be aligned in the order of the eighth antenna element, the seventh antenna element, the center, the fifth antenna element, and the sixth antenna element; and the total number of antenna elements to which power is supplied by a power supply line for supplying power to the seventh antenna element may be smaller than the total number of antenna elements to which power is supplied by a power supply line for supplying power to the eighth antenna element.

According to this configuration, the power supplied to the eighth antenna element located on the end portion side of the region containing all the plurality of antenna elements becomes smaller than the power supplied to the seventh antenna element located on the center side of the above region, thereby making it possible to suppress the side lobes more effectively in the second direction. Specifically, the side lobes in four directions toward upper, lower, right, and left sides in a plan view with respect to the center of the region containing all the plurality of antenna elements (for example, the center of the dielectric substrate) can be suppressed.

The plurality of antenna elements may be disposed on one principal surface side of the dielectric substrate; the radio frequency circuit element may be disposed on another principal surface side of the dielectric substrate; the dielectric substrate may include a plurality of insulator layers being laminated and a conductor column passing through two or more insulator layers among the plurality of insulator layers; the conductor column may include a first via conductor passing through a first insulator layer and a second via conductor passing through a second insulator layer adjacent to the first insulator layer; each of the first via conductor and the second via conductor may have a tapered shape in which a cross section becomes smaller from one end portion toward the other end portion in a lamination direction of the plurality of insulator layers; the first via conductor and the second via conductor may be joined in such a manner that each large-diameter portion which is an end portion with a larger cross section or each small-diameter portion which is an end portion with a smaller cross section is directly joined to each other; and the conductor column may be disposed in a path connecting the antenna elements constituting the antenna element group including the second antenna element and the power supply terminal included in the radio frequency circuit element.

The path connecting one power supply terminal and the antenna elements constituting the antenna element group including the second antenna element is a branched path in order to connect the one power supply terminal and the plurality of antenna elements connected to each other. This causes the path to have a complicated structure and the wiring length may become long, so that the wiring loss is increased. On the other hand, each of the first via conductor and the second via conductor constituting the conductor column in the path has a tapered shape in which a cross section becomes smaller from one end portion toward another end portion in the lamination direction of the plurality of insulator layers. Since the large-diameter portions or small-diameter portions of the first via conductor and the second via conductor are directly joined to each other, it is possible to reduce a step, formed between the first via conductor and the second via conductor, which causes the loss in the conductor column. Therefore, the loss of the conductor column can be suppressed, that is, the loss in the path can be suppressed.

The plurality of antenna elements may be disposed on one principal surface side of the dielectric substrate; the radio frequency circuit element may be disposed on another principal surface side of the dielectric substrate; the dielectric substrate may include a plurality of insulator layers being laminated and a conductor column passing through two or more insulator layers among the plurality of insulator layers; the conductor column may include a first via conductor passing through a first insulator layer, a second via conductor passing through a second insulator layer adjacent to the first insulator layer, and an electrode pad which is disposed between the first insulator layer and the second insulator layer, and one principal surface of which is joined to the first via conductor and another principal surface of which is joined to the second via conductor; each of the first via conductor and the second via conductor may have a tapered shape in which a cross section becomes smaller from one end portion toward the other end portion in a lamination direction of the plurality of insulator layers; the first via conductor and the second via conductor may be joined in such a manner that each large-diameter portion which is an end portion with a larger cross section or each small-diameter portion which is an end portion with a smaller cross section is joined to each other with the electrode pad interposed between the large-diameter portions or the small-diameter portions; the electrode pad may have a shape disposed at the inside of at least one of the large-diameter portion of the first via conductor and the larger-diameter portion of the second via conductor when viewed in the lamination direction; and the conductor column may be disposed in a path connecting the antenna elements constituting the antenna element group including the second antenna element and the power supply terminal included in the radio frequency circuit element.

The path connecting one power supply terminal and the antenna elements constituting the antenna element group including the second antenna element is a branched path in order to connect the one power supply terminal and the plurality of antenna elements connected to each other. This causes the path to have a complicated structure and the wiring length may become long, so that the wiring loss is increased. On the other hand, each of the first via conductor and the second via conductor constituting the conductor column in the path has a tapered shape in which a cross section becomes smaller from one end portion toward the other end portion in the lamination direction of the plurality of insulator layers, and the first via conductor and the second via conductor are joined in such a manner that each large-diameter portion which is an end portion with a larger cross section or each small-diameter portion which is an end portion with a smaller cross section is joined to each other with the electrode pad interposed between the large-diameter portions or the small-diameter portions. Since the large-diameter portions or small-diameter portions of the first via conductor and the second via conductor are joined to each other with the electrode pad of the above-described shape interposed therebetween, it is possible to reduce a step, formed between the first via conductor and the second via conductor, which causes the loss in the conductor column. Therefore, the loss of the conductor column can be suppressed, that is, the loss in the path can be suppressed.

The radio frequency circuit element may include a phase-shift circuit configured to shift a phase of a radio frequency signal, an amplification circuit configured to amplify the phase-shifted radio frequency signal, and a switch element configured to switch whether or not to supply the amplified radio frequency signal to the antenna element.

According to this configuration, a multiband/multi-mode antenna module can be achieved.

With the antenna module according to the present disclosure, side lobes can be suppressed.

DETAILED DESCRIPTION

Figure 1:
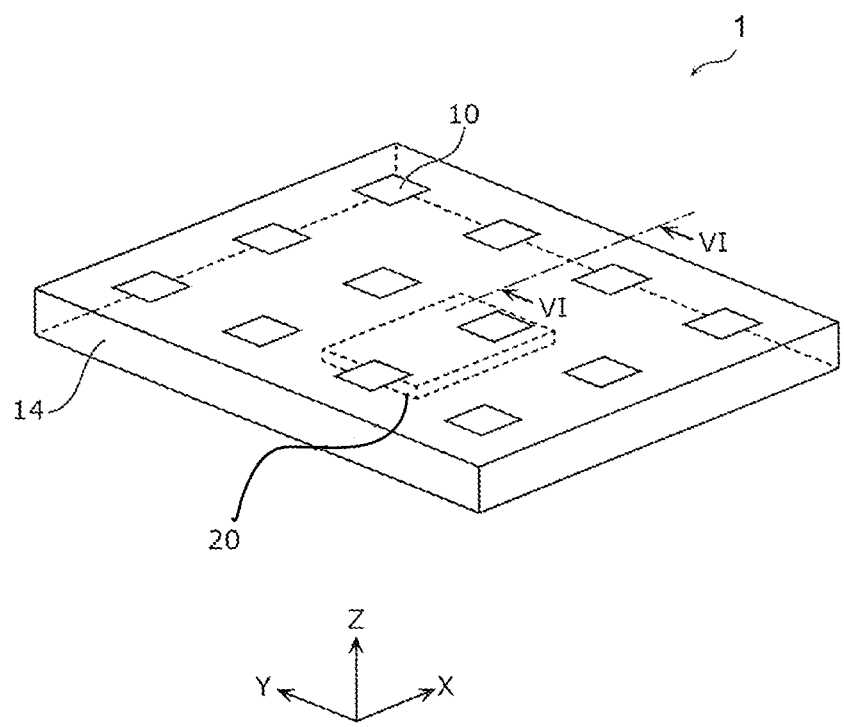
FIG. 1 is an external perspective view of an antenna module according to a first embodiment.

Hereinafter, embodiments of the present disclosure will be described in detail with reference to the accompanying drawings. Any of the embodiments described below is a comprehensive or specific example. The numerical values, shapes, materials, constituent elements, arrangement and connection modes of the constituent elements, and the like indicated in the following embodiments are merely examples, and are not intended to limit the present disclosure. Of the constituent elements in the following embodiments, constituent elements not described in the independent claims will be described as optional constituent elements. Note that the sizes or the ratios of sizes of the constituent elements illustrated in the drawings are not necessarily strict. In the drawings, same reference signs are assigned to substantially the same constituent elements, and redundant description thereof may be omitted or simplified. In the following description, an electrical connection may also be referred to simply as a connection.

First Embodiment

1. Antenna Module Structure

FIG. 1 is an external perspective view of an antenna module 1 according to a first embodiment.

Hereinafter, a thickness direction of the antenna module 1 will be described as a Z axis direction, directions perpendicular to the Z axis direction and orthogonal to each other will be described as an X axis direction and a Y axis direction respectively, and a positive side of the Z axis will be described as an upper surface side of the antenna module 1. However, in an actual usage mode, since the thickness direction of the antenna module 1 does not take an upward-downward direction in some case, the upper surface side of the antenna module 1 is not limited to the upward direction.

The antenna module 1 illustrated in FIG. 1 is an antenna module for wireless communication including a dielectric substrate 14, a plurality of antenna elements 10 formed on the dielectric substrate 14 and two-dimensionally arranged, and a radio frequency circuit element (RFIC) 20 formed on the dielectric substrate 14 and having a plurality of power supply terminals for supplying power to the plurality of antenna elements 10.

For example, the plurality of antenna elements 10 are disposed on one principal surface side (upper surface side) of the dielectric substrate 14, and the RFIC 20 is disposed on another principal surface side (bottom surface side) thereof. The dielectric substrate 14 has a structure in which a dielectric material is filled between the upper surface and the bottom surface. The plurality of antenna elements 10 and the RFIC 20 (the plurality of power supply terminals) are connected via conductor columns or wiring pattern conductors provided inside the dielectric substrate 14.

Each of the plurality of antenna elements 10 is a patch antenna that is formed of a pattern conductor of a thin film and is disposed parallel to the principal surface of the dielectric substrate 14. The plurality of antenna elements 10 are periodically arranged two-dimensionally to constitute an array antenna. Each of the plurality of antenna elements has a power supply point through which a transmission signal is transmitted between the antenna element and the RFIC 20. In the present embodiment, the plurality of antenna elements 10 are constituted of 12 antenna elements 10 of four rows and three columns arranged two-dimensionally (that is, arranged in matrix form) along the X axis direction and the Y axis direction. The antenna element 10 has a rectangular shape, for example, in a plan view of the dielectric substrate 14 (viewed in a direction perpendicular to the principal surface of the dielectric substrate 14), but may have a circular shape, a polygonal shape, or the like. The plurality of antenna elements 10 are not limited to the orthogonal arrangement described above, and may be arranged in the form of a plurality of concentric circles having different diameters.

The number of antenna elements 10 constituting the array antenna is not limited to the above one, and may be equal to or greater than three of one or more rows and three or more columns. Further, the arrangement mode of the plurality of antenna elements 10 is not limited to the above one. For example, the array antenna may be constituted of the antenna elements 10 arranged one-dimensionally, or may be constituted of the antenna elements 10 arranged in a staggered manner.

The RFIC 20 is disposed on the dielectric substrate 14, and constitutes an RF signal processing circuit configured to process transmission signals transmitted by the plurality of antenna elements 10 or reception signals received by the plurality of antenna elements 10. In the present embodiment, the RFIC 20 is disposed on the bottom surface of the dielectric substrate 14. The arrangement mode of the RFIC 20 is not limited to the above one, and the RFIC 20 may be provided at a position different from positions of the plurality of antenna elements 10 in the same layer as the layer where the plurality of antenna elements 10 are disposed, for example. Further, the RFIC 20 may be incorporated in the dielectric substrate 14.

2. Dielectric Substrate Structure

Next, the structure of the dielectric substrate 14 will be described with reference to FIG. 2.

Figure 2:
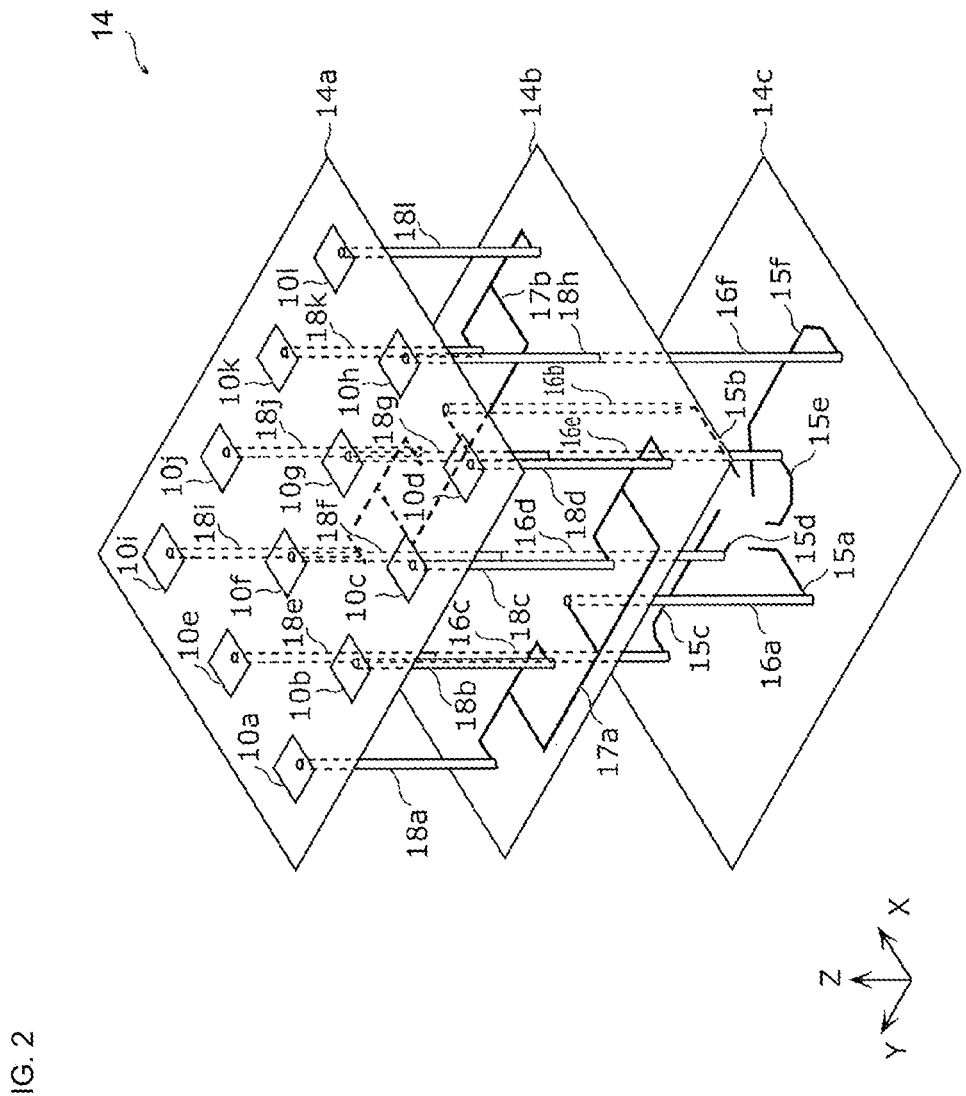
FIG. 2 is a diagram for explaining a structure of a dielectric substrate according to the first embodiment.

FIG. 2 is a diagram for explaining the structure of the dielectric substrate 14 according to the first embodiment. FIG. 2 is an external perspective view of the dielectric substrate 14, in which the dielectric substrate 14 is enlarged in the thickness direction (Z axis direction), and only illustrated are an upper layer 14a where the antenna elements 10 are disposed, a middle layer 14b and a lower layer 14c where wiring pattern conductors are provided, and conductor columns; other constituent elements are not illustrated. In FIG. 2, antenna elements 10a to 10l are illustrated as the plurality of antenna elements 10 disposed on the upper layer 14a.

Wiring pattern conductors 15a to 15f are provided in the lower layer 14c. The wiring pattern conductors 15a to 15f are connected to different power supply terminals 21a to 21f (not illustrated in FIG. 2), respectively, included in the RFIC 20.

Conductor columns 18a to 18l are provided between the upper layer 14a and the middle layer 14b, and the conductor columns 18a to 18l are connected to the antenna elements 10a to 10l, respectively. Conductor columns 16a to 16f are provided between the middle layer 14b and the lower layer 14c, and the conductor columns 16a to 16f are connected to the wiring pattern conductors 15a to 15f, respectively.

Wiring pattern conductors 17a and 17b are provided in the middle layer 14b. The wiring pattern conductor 17a has a structure in which one wiring pattern conductor connected to the conductor column 16a is branched into two, and each of the branched wiring pattern conductors is further branched into two; that is, the wiring pattern conductor 17a is consequently branched into four. After the wiring pattern conductor 17a being branched into four pieces, these pieces are connected to the conductor columns 18a to 18d, respectively. The wiring pattern conductor 17b has a structure in which one wiring pattern conductor connected to the conductor column 16b is branched into two, and each of the branched wiring pattern conductors is further branched into two; that is, the wiring pattern conductor 17b is consequently branched into four. After the wiring pattern conductor 17b being branched into four pieces, these pieces are connected to the conductor columns 18i to 18l, respectively. The conductor columns 16c to 16f are not connected to branched wiring pattern conductors such as the wiring pattern conductors 17a and 17b, but are directly connected to the conductor columns 18e to 18h, respectively. In this manner, the power supply terminals 21a to 21f and the antenna elements 10a to 10l are connected via the conductor columns and wiring pattern conductors provided in the dielectric substrate 14, and these connections will be described below in more detail with reference to FIG. 3.

Figure 3:
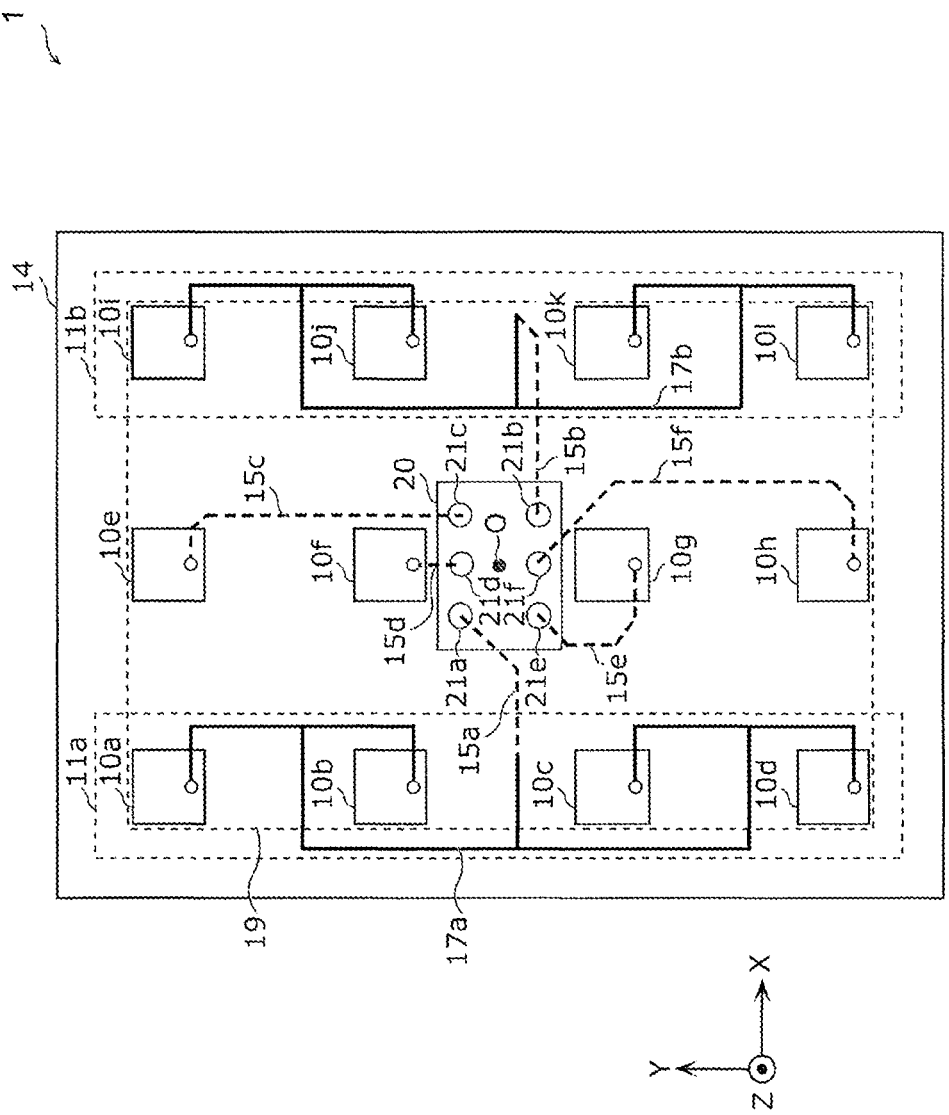
FIG. 3 is a see-through plan view of the antenna module according to the first embodiment.

FIG. 3 is a see-through plan view of the antenna module 1 according to the first embodiment. FIG. 3 illustrates a plan view of the antenna module 1 when the dielectric material, conductor columns, and the like constituting the dielectric substrate 14 are seen through; in the drawing, the RFIC 20, the wiring pattern conductors, and the antenna elements 10 are depicted.

The power supply terminals 21a to 21f included in the RFIC 20 are respectively connected to different antenna element groups (to be described later). For example, the power supply terminal 21a is connected to the antenna elements 10a to 10d via the wiring pattern conductor 15a, the conductor column 16a, the wiring pattern conductor 17a, and the conductor columns 18a to 18d. The power supply terminal 21b is connected to the antenna elements 10i to 10l via the wiring pattern conductor 15b, the conductor column 16b, the wiring pattern conductor 17b, and the conductor columns 18i to 18l. The power supply terminal 21c is connected to the antenna element 10e via the wiring pattern conductor 15c, and the conductor columns 16c and 18e. The power supply terminal 21d is connected to the antenna element 10f via the wiring pattern conductor 15d, and the conductor columns 16d and 18f. The power supply terminal 21e is connected to the antenna element 10g via the wiring pattern conductor 15e, and the conductor columns 16e and 18g. The power supply terminal 21f is connected to the antenna element 10h via the wiring pattern conductor 15f, and the conductor columns 16f and 18h.

In this case, the antenna elements 10a to 10d are connected to one another, and the antenna elements 10i to 10l are connected to one another. As described above, the plurality of antenna elements 10 include a plurality of antenna element groups each constituted of one antenna element or two or more antenna elements connected to each other. As indicated in FIG. 3, an antenna element group 11a is constituted of the antenna elements 10a to 10d connected to one another, and an antenna element group 11b is constituted of the antenna elements 10i to 10l connected to one another. A group of two or more antenna elements electrically connected to each other is defined as an antenna element group. Further, for example, like the antenna elements 10e to 10h, in a case where the antenna elements are not electrically connected with other antenna elements, each of the antenna elements is defined as an antenna element group even when the defined antenna element group is constituted of one antenna element. Therefore, there is a case in which the antenna element group is constituted of one antenna element. Each antenna element group corresponds to one or more antenna elements 10, to which power is supplied through the power supply lines connected to the plurality of power supply terminals 21a to 21f.

As illustrated in FIG. 3, the antenna element groups 11a and 11b and the antenna elements 10e to 10h are not connected to other antenna element groups, and the plurality of antenna element groups are not electrically connected to one another. The plurality of power supply terminals 21a to 21f are respectively connected to different antenna element groups.

The plurality of antenna elements 10 include a first antenna element and a second antenna element disposed along a first direction connecting two points within a region 19 containing all the plurality of antenna elements 10 in a plan view of the dielectric substrate 14. Since the above-described two points are not particularly limited, the first direction is an optional direction. The region 19 is a minimum region encompassing the plurality of antenna elements 10 in a plan view of the dielectric substrate 14, and is a region having a substantially rectangular shape in the present embodiment.

The first antenna element is located on the side of a center O of the region 19 relative to the second antenna element. For example, when the first direction is set to be the X axis direction, the first antenna element is any one of the antenna elements 10e to 10h, and the second antenna element is any one of the antenna elements 10i to 10l or any one of the antenna elements 10a to 10d. For example, the first antenna element is set to be the antenna element 10e, and the second antenna element is set to be the antenna element 10i, which is located on an end portion side of the region 19 along the first direction relative to the antenna element 10e.

The total number of antenna elements constituting the antenna element group including the antenna element 10e is one, while the total number of antenna elements constituting the antenna element group 11b including the antenna element 10i is four. In other words, the total number of antenna elements (one) to which power is supplied by the power supply line (the conductor column 18e) for supplying power to the antenna element 10e is smaller than the total number of antenna elements (four) to which power is supplied by the power supply line (the conductor column 16b, wiring pattern conductor 17b, and conductor column 18i) for supplying power to the antenna element 10i.

Further, for example, the first antenna element may be set to be the antenna element 10e, and the second antenna element is set to be the antenna element 10a, which is located on an end portion side of the region 19 along the first direction relative to the antenna element 10e. In this case, the total number of antenna elements constituting the antenna element group including the antenna element 10e is one, while the total number of antenna elements constituting the antenna element group 11a including the antenna element 10a is four. In other words, the total number of antenna elements (one) to which power is supplied by the power supply line (the conductor column 18e) for supplying power to the antenna element 10e is smaller than the total number of antenna elements (four) to which power is supplied by the power supply line (the conductor column 16a, wiring pattern conductor 17a, and conductor column 18a) for supplying power to the antenna element 10a.

In this manner, the total number of antenna elements to which power is supplied by the power supply line for supplying power to the first antenna element is smaller than the total number of antenna elements to which power is supplied by the power supply line for supplying power to the second antenna element, and the total number of antenna elements constituting the antenna element group including the first antenna element is smaller than the total number of antenna elements constituting the antenna element group including the second antenna element.

With this configuration, in the antenna element group 11a, power is supplied to four antenna elements 10a to 10d from the single power supply terminal 21a, and in the antenna element group 11b, power is supplied to four antenna elements 10i to 10l from the single power supply terminal 21b. On the other hand, the antenna element 10e to 10h are supplied with power from the single power supply terminal 21C to the single power supply terminal 21f, respectively. Accordingly, the power supplied to the antenna elements 10a to 10d and 10i to 10l is smaller than the power supplied to the antenna elements 10e to 10h. This is because, as the number of antenna elements connected to a single power supply terminal becomes larger, the power that can be supplied to each antenna element becomes smaller.

In order to explain the effect achieved by making the power supplied to the antenna element 10 located on the end portion side of the region 19 smaller than the power supplied to the antenna element 10 located on the center O side among the plurality of antenna elements 10, Comparative Example 1 in which the power supplied to the plurality of antenna elements 10 is uniform will be described below.

Figure 4:
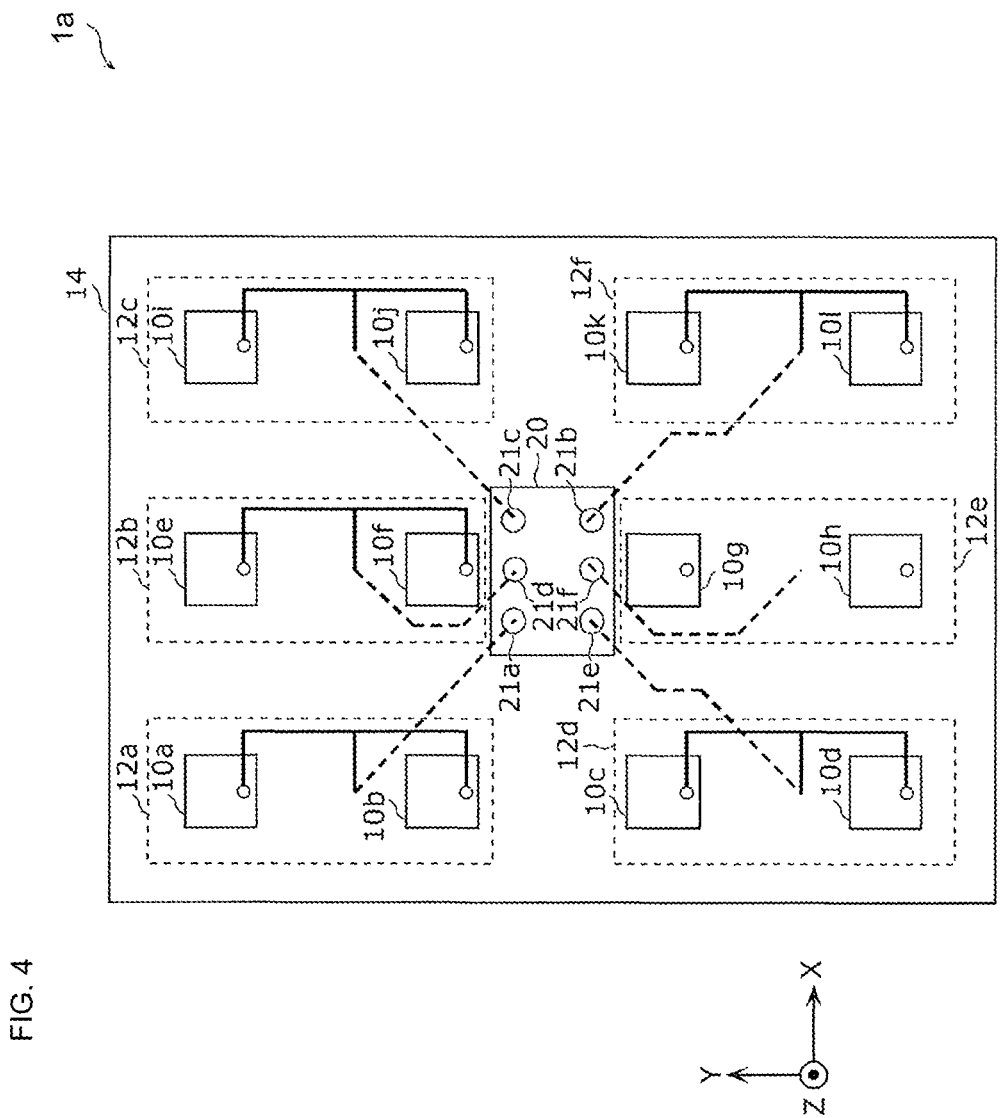
FIG. 4 is a see-through plan view of an antenna module according to Comparative Example 1.

FIG. 4 is a see-through plan view of an antenna module 1a according to Comparative Example 1. FIG. 4, similarly to FIG. 3, illustrates a plan view of the antenna module 1a when the dielectric material and conductor columns constituting a dielectric substrate 14 are seen through; in the drawing, an RFIC 20, wiring pattern conductors, and antenna elements 10 are depicted.

In the antenna module 1a, the plurality of antenna elements 10 are each connected to another antenna element 10, and include a plurality of antenna element groups 12a to 12f each constituted of two antenna elements 10 connected to each other. Thus, the power supplied to the antenna elements 10 constituting each of the antenna element groups is uniform.

Figure 5:
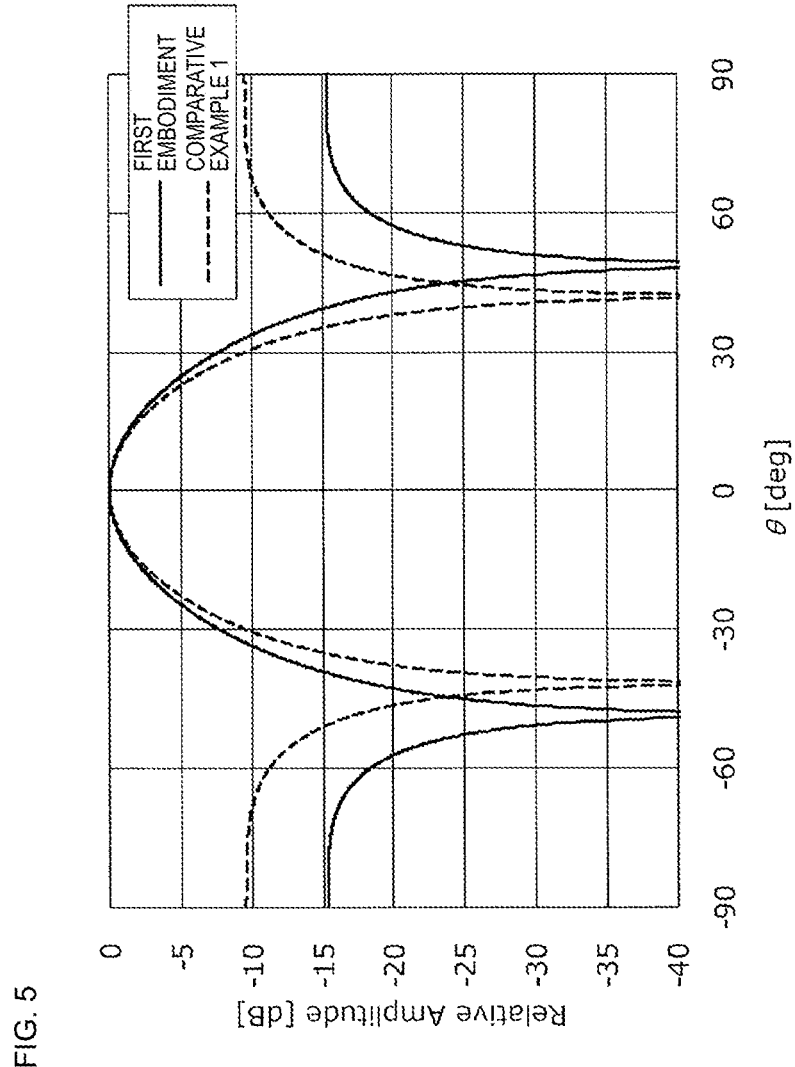
FIG. 5 is a graph illustrating directivity characteristics of the antenna module according to the first embodiment and the antenna module according to Comparative Example 1.

FIG. 5 is a graph illustrating directivity characteristics of the antenna module 1 according to the first embodiment and the antenna module 1a according to Comparative Example 1. In FIG. 5, the directivity characteristics of the antenna module 1 according to the first embodiment are indicated by a solid line, and the directivity characteristics of the antenna module 1a according to Comparative Example 1 are indicated by a broken line. FIG. 5 illustrates relative intensity, when the intensity in the positive Z axis direction is set to 0 dB, in which the positive Z axis direction is set to 0 degrees and the angle is changed in the positive X axis direction and the negative X axis direction.

As illustrated in FIG. 5, it is understood that the side lobes of the antenna module 1 according to the first embodiment are suppressed compared to the side lobes of the antenna module 1a according to Comparative Example 1.

3. Configuration of Conductor Column and Periphery Thereof

The path connecting one power supply terminal and the antenna elements constituting the antenna element group including the second antenna element is a branched path like the wiring pattern conductors 17a and 17b in order to connect the one power supply terminal and the plurality of antenna elements connected to each other. This causes the path to have a complicated structure and the wiring length may become long, so that the wiring loss is increased. As such, a conductor column able to suppress the loss in the path will be described.

Figure 6:
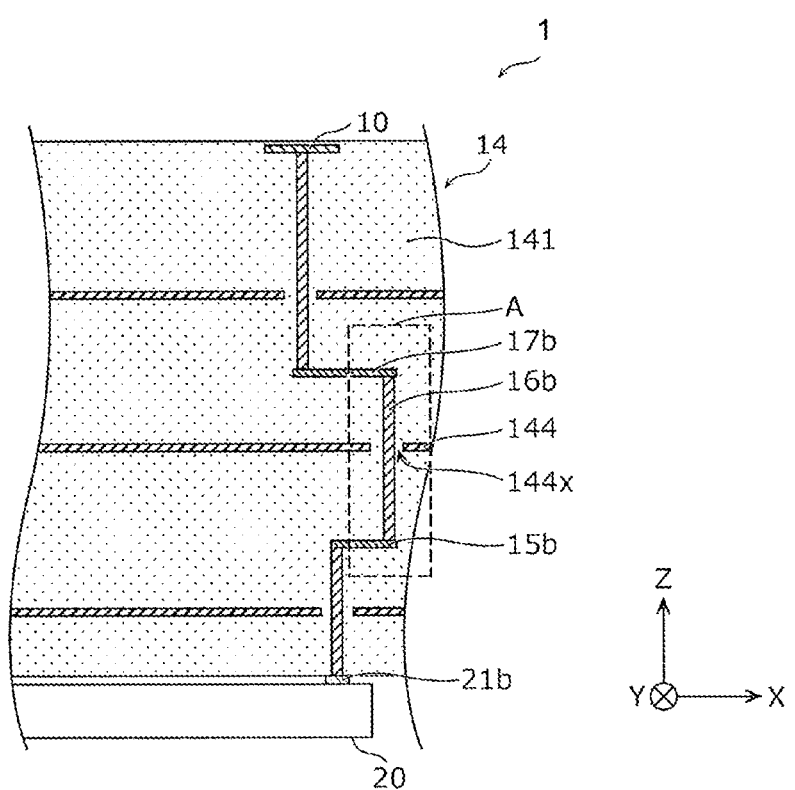
FIG. 6 is a cross-sectional view in which part of the antenna module according to the first embodiment is enlarged and depicted.

FIG. 6 is a cross-sectional view in which part of the antenna module 1 is enlarged and depicted. Specifically, a cross-sectional view taken along a VI-VI line in FIG. 1 is illustrated in FIG. 6. In FIG. 6, for the sake of simplicity, there may be a case in which a constituent element existing in a different cross section in strict is illustrated in the same cross section, or a case in which a constituent element existing in the same cross section in strict is not illustrated. Note that the dielectric substrate 14 may be provided with a conductor column for grounding in order to set a ground conductor to be described later to a ground potential, but is not illustrated in the drawing. In FIG. 6, the RFIC 20 is illustrated in a side view.

The dielectric substrate 14 is a substrate formed by laminating a plurality of insulator layers, and includes a substrate base body 141 made of a dielectric material and various conductors provided in the substrate base body 141. The substrate base body 141 is constituted of a plurality of insulator layers being laminated. The various conductors include the antenna elements 10, the wiring pattern conductors, the conductor columns, a ground conductor 144, and surface electrodes (power supply terminals) for mounting the RFIC 20. The antenna element 10, the wiring pattern conductor, the ground conductor, and the surface electrode are formed of a pattern conductor. On the other hand, the conductor column is constituted of two or more via conductors. Herein, the wiring pattern conductors 15b and 17b and the conductor column 16b, which are connected to the power supply terminal 21b, will be focused and described.

The wiring pattern conductor is a plate-shaped or thin film-like conductor provided in a direction orthogonal to the lamination direction of the dielectric substrate 14, that is, in parallel to the principal surface of the dielectric substrate 14. On the other hand, the via conductor is a columnar conductor provided in the lamination direction of the dielectric substrate 14.

The wiring pattern conductors 15b and 17b and the conductor column 16b constitute a power supply line. That is, the wiring pattern conductors 15b and 17b and the conductor column 16b constitute a transmission line for transmitting a radio frequency signal. Note that, for example, when the dielectric substrate 14 is viewed in the lamination direction, in a case where the position of a power supply point as a connection point of the power supply line to the antenna element 10 overlaps with the position of a terminal of the RFIC 20 connected to the power supply line, the power supply line may be constituted of only the conductor column 16b.

The wiring pattern conductors 15b and 17b are provided in different layers from each other, and the conductor column 16b connects the wiring pattern conductor 15b and the wiring pattern conductor 17b.

The conductor column 16b passes through two or more insulator layers of the plurality of insulator layers constituting the substrate base body 141. The configuration of the conductor column 16b and its periphery will be described in detail later. The dielectric substrate 14 may be provided with not only the conductor column 16b passing through two or more insulator layers but also a conductor column passing through only one insulator layer.

A plurality of layers of ground conductors 144 are disposed while sandwiching layers where the wiring pattern conductors 15b and 17b are provided, and are set to the ground potential. The ground conductor 144 is disposed substantially across the entirety of the dielectric substrate 14 when the dielectric substrate 14 is viewed in the lamination direction, except for the portion where the conductor column 16b is provided, for example. To rephrase, the ground conductor 144 has an opening 144x through which the conductor column 16b passes.

In the present embodiment, three layers of the ground conductors 144 are disposed, and the ground conductor 144 disposed closest to the antenna element 10 among the three layers of the ground conductors functions as a ground conductor of the antenna element 10 serving as a patch antenna. The number of layers of the ground conductors 144 is not limited thereto, and may be two or the like, for example.

As the above-described dielectric substrate 14, a low temperature co-fired ceramics (LTCC) substrate, a printed circuit board, or the like is used. As various conductors for the dielectric substrate 14, Al, Cu, Au, Ag, or a metal mainly containing an alloy of these metals is used.

Next, the configuration of the conductor column 16b and its periphery will be described in detail while exemplifying a configuration illustrated in a portion A in FIG. 6. Since the configuration of the conductor column and its periphery in other portions is similar to the configuration illustrated in the portion A except that the insulator layers through which the conductor column 16b passes and the number of the layers are different, or that the wiring pattern conductors to which the conductor column 16b is connected are different, detailed description thereof will be omitted.

Figure 7A:
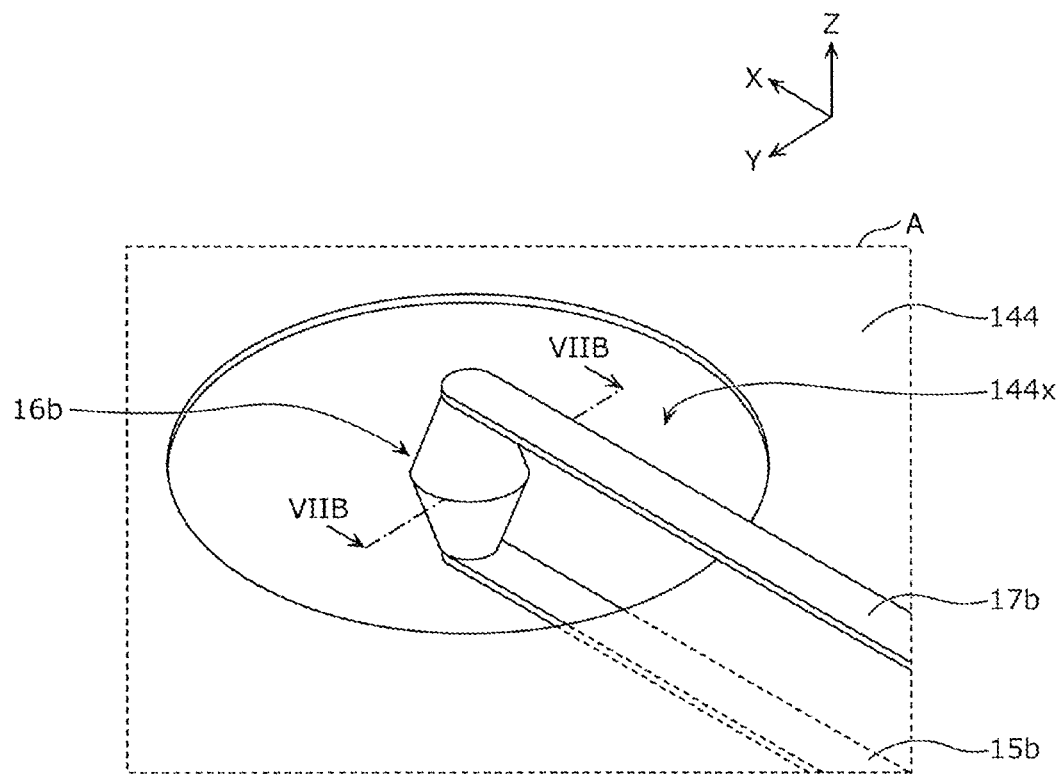
FIG. 7A is a perspective view of a conductor column and the periphery thereof according to the first embodiment.
Figure 7B:
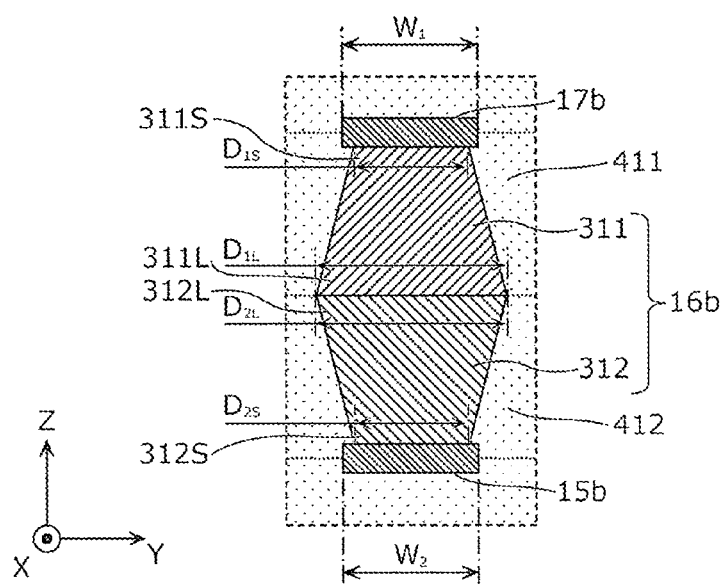
FIG. 7B is a cross-sectional view of the conductor column and the periphery thereof according to the first embodiment.

FIG. 7A is a perspective view of the conductor column 16b and the periphery thereof according to the present embodiment. To be specific, the portion A in FIG. 6 is enlarged and depicted in FIG. 7A. FIG. 7B is a cross-sectional view of the conductor column 16b and the periphery thereof according to the present embodiment. Specifically, in FIG. 7B, a cross section taken along a VIIB-VIIB line illustrated in FIG. 7A is illustrated. In FIG. 7A, for the sake of simplicity, the insulator layers are not illustrated. This applies to the subsequent perspective views.

As illustrated in these drawings, the conductor column 16b in the portion A passes through two insulator layers 411 and 412 among the plurality of insulator layers constituting the substrate base body 141. Specifically, the conductor column 16b includes via conductors 311 and 312. The via conductor 311 is an example of a first via conductor passing through a first insulator layer, and passes through the insulator layer 411, which is an example of the first insulator layer. The via conductor 312 is an example of a second via conductor passing through a second insulator layer adjacent to the first insulator layer, and passes through the insulator layer 412, which is an example of the second insulator layer. The insulator layer 412 is located under the insulator layer 411. That is, the via conductor 312 is located under the via conductor 311.

Each of the via conductors 311 and 312 has a tapered shape in which a cross section becomes smaller from one end portion toward the other end portion in the lamination direction (in a direction perpendicular to the upper surface of the via conductor 311) of the plurality of insulator layers.

Specifically, the via conductor 311 has an inverse tapered shape in which the cross section becomes larger from an upper surface toward a bottom surface. That is, the upper surface of the via conductor 311 is a small-diameter portion 311S, which is an end portion having a smaller cross section, and the bottom surface of the via conductor 311 is a large-diameter portion 311L, which is an end portion having a larger cross section. On the other hand, the via conductor 312 has a forward tapered shape in which a cross section becomes smaller from the upper surface toward the bottom surface. That is, the upper surface of the via conductor 312 is a large-diameter portion 312L, which is an end portion having a larger cross section, and the bottom surface of the via conductor 312 is a small-diameter portion 312S, which is an end portion having a smaller cross section.

In the present embodiment, each of the via conductors 311 and 312 is formed in a truncated cone shape. Specifically, the via conductor 311 has the truncated cone shape in which the diameter of the small-diameter portion 311S is $D_{1S}$, and the diameter of the large-diameter portion 311L is $D_{1L}$ (here, $D_{1S}<D_{1L}$). The via conductor 312 has a tapered shape in which the diameter of the small-diameter portion 312S is $D_{2S}$, and the diameter of the large-diameter portion 312L is $D_{2L}$ (here, $D_{2S}<D_{2L}$). The diameters of the small-diameter portions 311S and 312S of the via conductors 311 and 312 are equal to each other (that is, $D_{1S}=D_{2S}$), and the diameters of the large-diameter portions 311L and 312L thereof are equal to each other (that is, $D_{1L}=D_{2L}$).

The shapes of the via conductors 311 and 312 are not limited to those described above, and may take a polygonal frustum shape, such as a truncated pyramid shape, whose upper and bottom surfaces are formed in a polygonal shape. In such a via conductor, any diameter between the maximum diameter and the minimum diameter of a surface as the large-diameter portion (for example, an average diameter) may be used as the diameter of the large-diameter portion. Any diameter between the maximum diameter and the minimum diameter of a surface as the small-diameter portion (for example, an average diameter) may be used as the diameter of the small-diameter portion. Further, at least one of the shape and the size may differ between the via conductor 311 and the via conductor 312.

The large-diameter portion 311L of the via conductor 311 having an inverse tapered shape and the large-diameter portion 312L of the via conductor 312 having a forward tapered shape are directly joined to each other. That is, the bottom surface of the via conductor 311 and the upper surface of the via conductor 312 are directly joined to each other without necessarily interposing an electrode pad or the like therebetween.

The small-diameter portion 311S of the via conductor 311 or the small-diameter portion 312S of the via conductor 312 is connected to a wiring pattern conductor. For example, a width of the wiring pattern conductor is less than the diameter of the large-diameter portion of the via conductor to which the wiring pattern conductor is connected among the via conductors 311 and 312.

Specifically, the small-diameter portion 311S of the via conductor 311 is connected to the wiring pattern conductor 17b described above. For example, the line width $W_1$ of the wiring pattern conductor 17b is less than the diameter $D_{1L}$ of the large-diameter portion 311L of the via conductor 311 (that is, $W_1<D_{1L}$). Likewise, the small-diameter portion 312S of the via conductor 312 is connected to the wiring pattern conductor 15b described above. For example, the line width $W_2$ of the wiring pattern conductor 15b is less than the diameter $D_{2L}$ of the large-diameter portion 312L of the via conductor 312 (that is, $W_2<D_{2L}$).

4. Configuration of Conductor Column and Periphery Thereof According to Another Configuration Example Further, the via conductor 311 and the via conductor 312 may be arranged such that the small-diameter portions 311S and 312S are joined to each other.

Figure 8A:
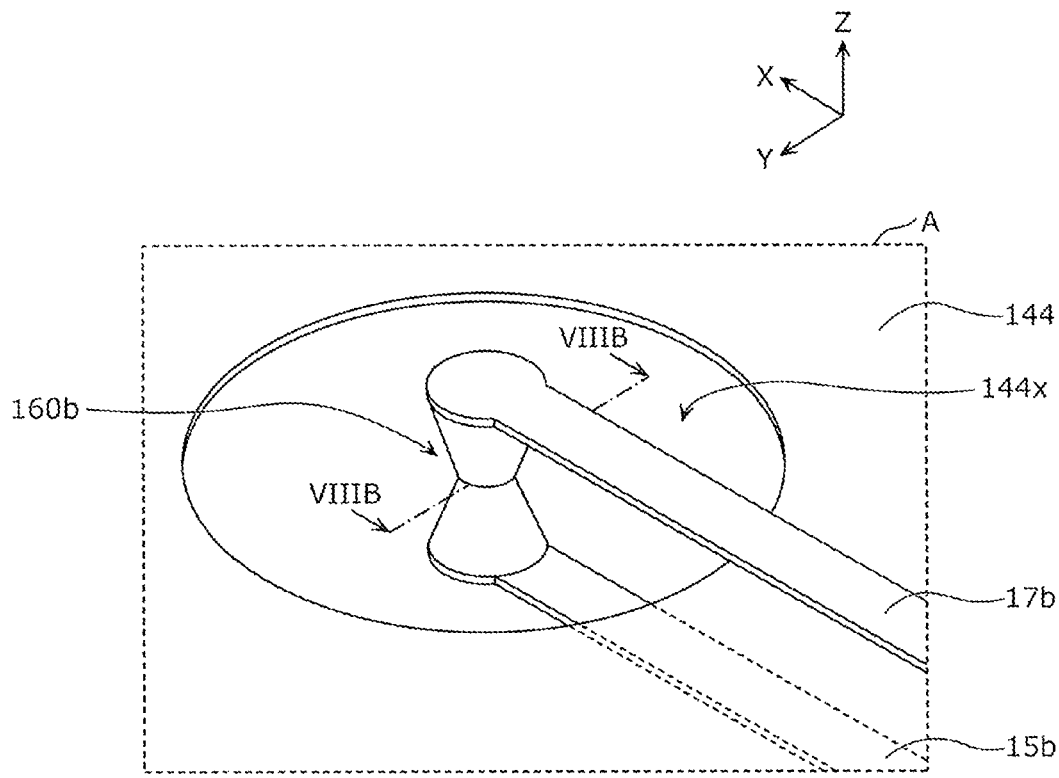
FIG. 8A is a perspective view of a conductor column and the periphery thereof according to another configuration example of the first embodiment.
Figure 8B:
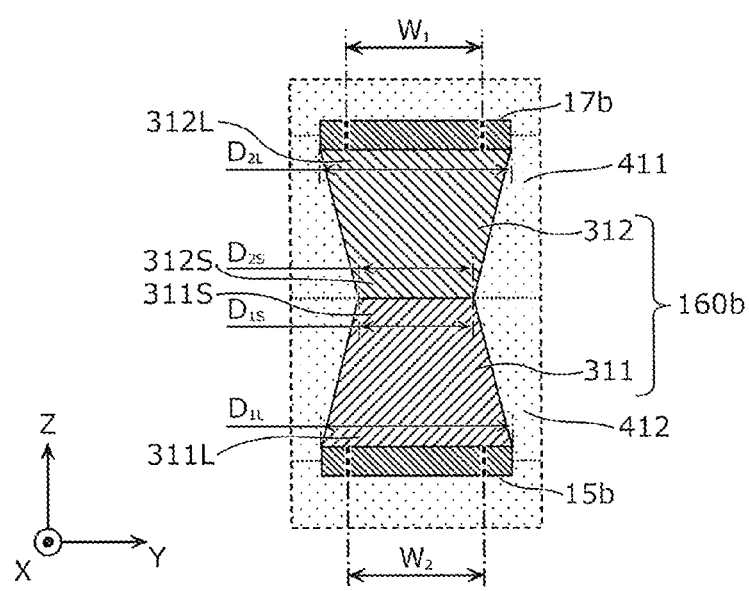
FIG. 8B is a cross-sectional view of the conductor column and the periphery thereof according to the another configuration example of the first embodiment.

FIG. 8A is a perspective view of a conductor column 160b and the periphery thereof according to another configuration example of the present embodiment. To be specific, a portion corresponding to the portion A in FIG. 6 is enlarged and depicted in FIG. 8A. FIG. 8B is a cross-sectional view of the conductor column 160b and the periphery thereof according to the another configuration example of the present embodiment. Specifically, in FIG. 8B, a cross section taken along a VIIIB-VIIIB line illustrated in FIG. 8A is illustrated.

As illustrated in these drawings, the conductor column 160b is different from the conductor column 16b described above in that the via conductor 311 and the via conductor 312 are joined in such a manner that the small-diameter portion 311S and the small-diameter portion 312S, which are end portions having smaller cross sections, are directly joined to each other. Specifically, in the conductor column 160b, the arrangement mode of the via conductors 311 and 312 is such that the positions thereof are exchanged in comparison with the conductor column 16b described above. That is, in this configuration example, the via conductor 312 is an example of the first via conductor passing through the first insulator layer, and passes through the insulator layer 411, which is an example of the first insulator layer. The via conductor 311 is an example of the second via conductor passing through the second insulator layer, and passes through the insulator layer 412, which is an example of the second insulator layer.

Here, the via conductor 312 having a forward tapered shape and the via conductor 311 having an inverse tapered shape are joined in such a manner that the small-diameter portions 311S and 312S are directly joined to each other. That is, the bottom surface of the via conductor 312 and the upper surface of the via conductor 311 are directly joined to each other without necessarily interposing an electrode pad or the like therebetween.

The large-diameter portion 311L of the via conductor 311 or the large-diameter portion 312L of the via conductor 312 is connected to a wiring pattern conductor. For example, the width of the wiring pattern conductor is less than the diameter of the large-diameter portion of the via conductor to which the wiring pattern conductor is connected among the via conductors 311 and 312.

Specifically, the large-diameter portion 312L of the via conductor 312 is connected to the wiring pattern conductor 17b described above. For example, the line width $W_1$ of the wiring pattern conductor 17b is less than the diameter $D_{2L}$ of the large-diameter portion 312L of the via conductor 312 (that is, $W_1 < D_{2L}$). Likewise, the large-diameter portion 311L of the via conductor 311 is connected to the wiring pattern conductor 15b described above. For example, the line width $W_2$ of the wiring pattern conductor 15b is less than the diameter $D_{1L}$ of the large-diameter portion 311L of the via conductor 311 (that is, $W_2 < D_{1L}$).

5. Configuration of Conductor Column and Periphery Thereof According to Comparative Example 2

The conductor columns 16b and 160b constituted as described above are able to suppress loss (that is, transmission loss) compared to a conductor column constituted by joining a plurality of via conductors, each having a forward tapered shape.

Figure 9A:
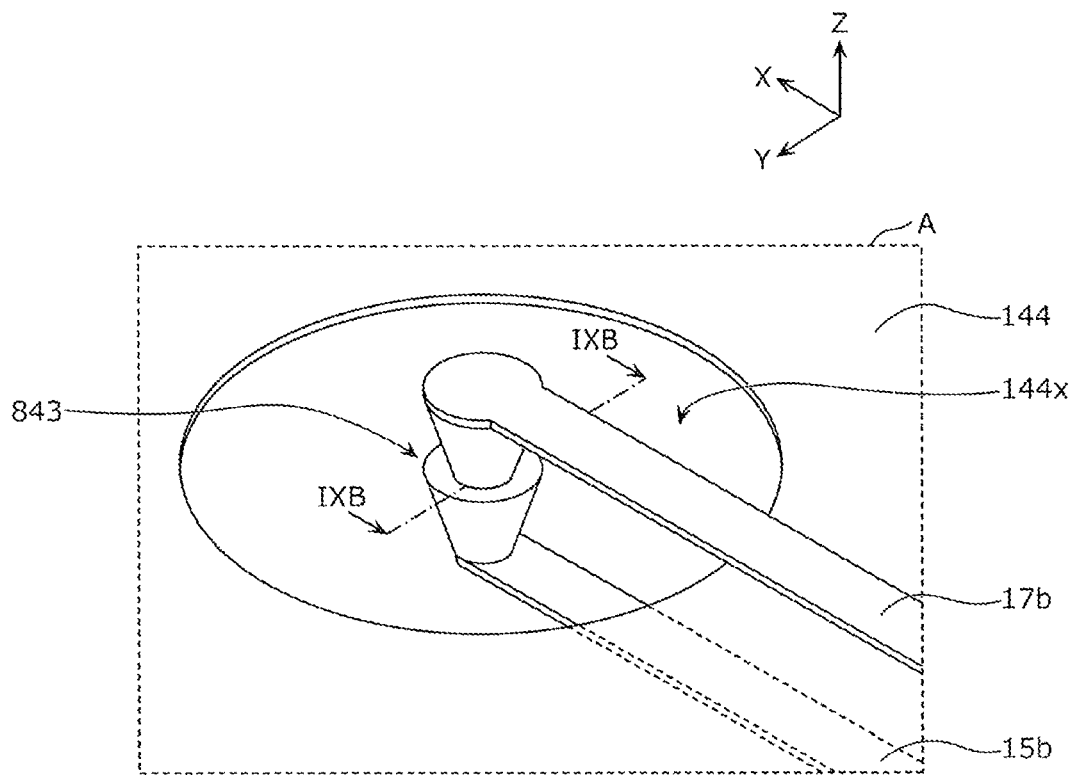
FIG. 9A is a perspective view of a conductor column and the periphery thereof according to Comparative Example 2 of the first embodiment.
Figure 9B:
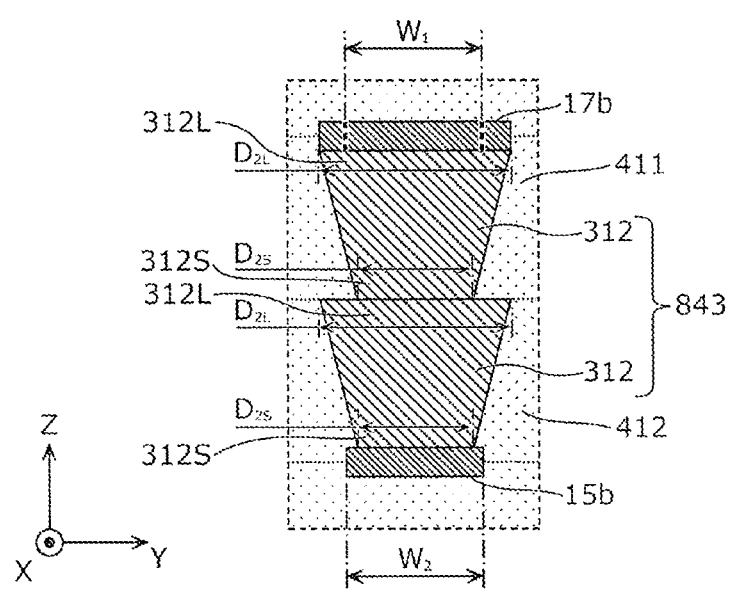
FIG. 9B is a cross-sectional view of the conductor column and the periphery thereof according to Comparative Example 2 of the first embodiment.

FIG. 9A is a perspective view of a conductor column 843 and the periphery thereof according to Comparative Example 2 of the present embodiment. To be specific, a portion corresponding to the portion A in FIG. 6 is enlarged and depicted in FIG. 9A. FIG. 9B is a cross-sectional view of the conductor column 843 and the periphery thereof according to Comparative Example 2 of the present embodiment. Specifically, in FIG. 9B, a cross section taken along a IXB-IXB line illustrated in FIG. 9A is illustrated.

As illustrated in these drawings, the conductor column 843 is different from the conductor columns 16b and 160b constituted of the via conductor 311 having an inverse tapered shape and the via conductor 312 having a forward tapered shape in that it is constituted of only the via conductors 312 having a forward tapered shape. That is, in Comparative Example 2, the small-diameter portion 312S and the large-diameter portion 312L of the via conductors 312 adjacent to each other are joined.

6. Comparison of Loss

Next, the effects exhibited by the conductor columns 16b and 160b will be described using simulation models of dielectric substrates of Working Examples 1 and 2 in comparison with Comparative Example 2. The dielectric substrates of Working Examples 1 and 2 include the conductor column 16b and the conductor column 160b, respectively. The dielectric substrate of Comparative Example 2 includes the conductor column 843. The simulation models have the same configuration except that the configurations of the conductor columns are different. Therefore, the simulation model of the dielectric substrate in Working Example 1 will be described below, and detailed description of the other simulation models will be omitted.

Figure 10:
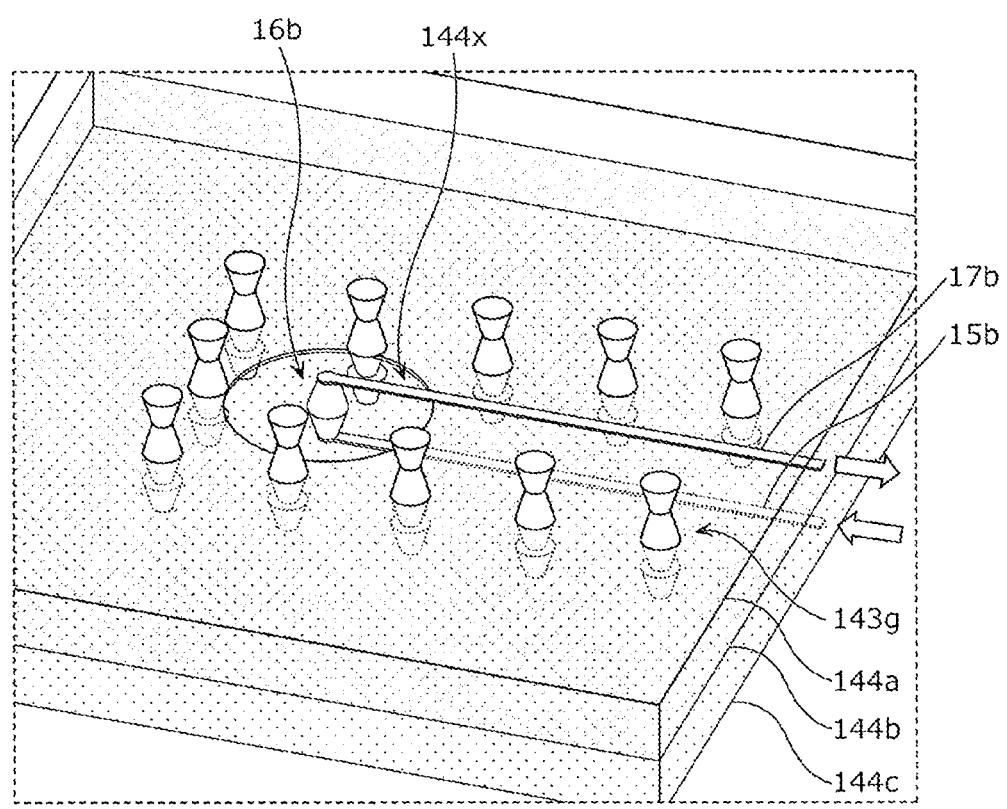
FIG. 10 is a perspective view illustrating a simulation model of Working Example 1.

FIG. 10 is a perspective view illustrating the simulation model of Working Example 1. In FIG. 10, for the sake of simplicity, among three layers of ground conductors 144a, 144b, and 144c, which are examples of the ground conductors 144, only the outer shape is illustrated for the ground conductor 144a of the uppermost layer, and the ground conductor 144b of the internal layer and the ground conductor 144c of the lowermost layer are hatched with dots.

The simulation model in the drawing includes four insulator layers (not illustrated) interposed between the ground conductors 144a and 144c. The wiring pattern conductor 17b connected to one end of the conductor column 16b is disposed between the insulator layer of a first layer (uppermost layer) and the insulator layer of a second layer interposed between the ground conductors 144a and 144b. In the insulator layers of the second layer and a third layer, the conductor column 16b is disposed passing through the insulator layers. The wiring pattern conductor 15b connected to the other end of the conductor column 16b is disposed between the insulator layer of the third layer and the insulator layer of a fourth layer interposed between the ground conductors 144b and 144c. Further, in the four-layered insulator layers, a conductor column 143g for grounding is provided passing through the insulator layers to connect the ground conductors 144a, 144b, and 144c.

The dimensions of the simulation model are as follows.

Line widths of wiring pattern conductors 17b and 15b: 0.03 mm-0.07 mm

Diameter of each via conductor: large-diameter portion=0.08 mm, small-diameter portion=0.04 mm Diameter of opening 144x (GND removal diameter): 0.2 mm Interval of conductor column 143g for ground connection (GND via pitch): 0.25 mm Height of each via conductor (via height): 0.06 mm Thickness of each of wiring pattern conductors 17b and 15b: 0.005 mm In this simulation model, a material having a dielectric constant ($\varepsilon$) of 3.4 to 6.4 and a dielectric tangent (tan $\sigma$) of 0.005 is set to be used as the insulator layer. In addition, it is set to use Cu having a conductivity of 58000000 S/m as the conductor.

Figure 11A:
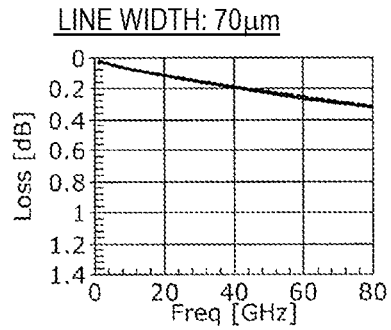
FIGS. 11AA-11AD include graphs depicting simulation results of Working Example 1, Working Example 2, and Comparative Example 2.
Figure 11A:
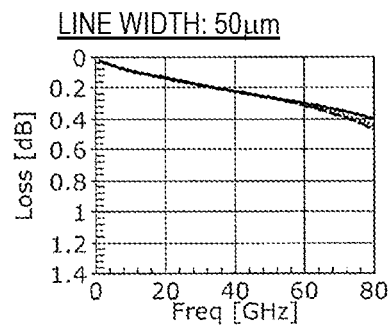
Figure 11A:
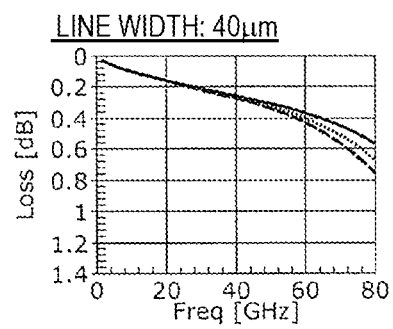
Figure 11A:
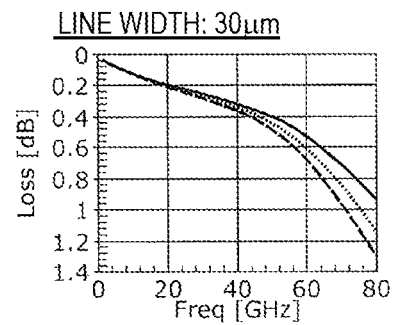
Figure 11B:
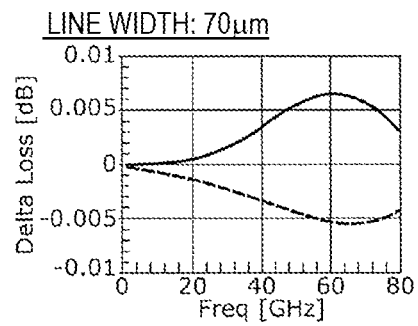
FIGS. 11BA-11BD include graphs depicting simulation results of Working Example 1 and Working Example 2 while setting Comparative Example 2 as a reference.
Figure 11B:
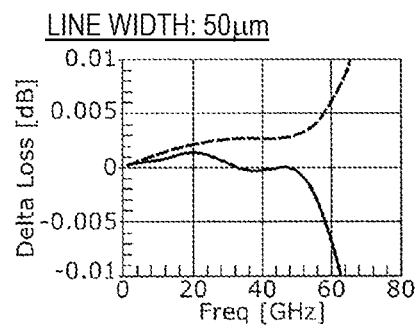
Figure 11B:
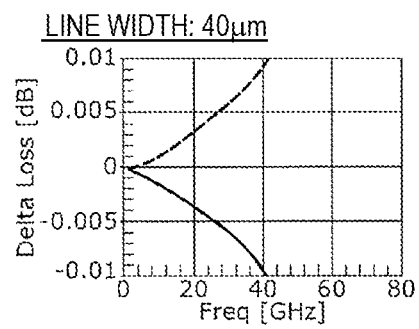
Figure 11B:
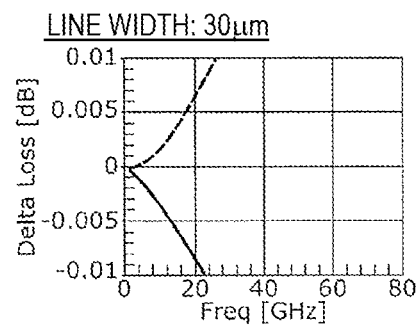

FIGS. 11AA-11AD include graphs depicting simulation results of Working Example 1, Working Example 2, and Comparative Example 2. Specifically, in the graphs, in a case where the line widths of the wiring pattern conductors 17b and 15b are set to 70 μm, 50 μm, 40 μm, and 30 μm, the ratio of the intensity of a radio frequency signal transmitted to the end portion of the wiring pattern conductor 17b to the intensity of a radio frequency signal supplied to the end portion of the wiring pattern conductor 15b is represented by an absolute value. That is, in the graphs, loss caused by the wiring pattern conductor 15b, the conductor column 16b, and the wiring pattern conductor 17b constituting a transmission path of the radio frequency signal is illustrated. FIGS. 11BA-11BD include graphs depicting simulation results of Working Example 1 and Working Example 2 while setting Comparative Example 2 as a reference. Specifically, in the graphs, illustrated is a difference obtained by subtracting a simulation result of Comparative Example 2 from simulation results of Working Examples 1 and 2. That is, when the difference is negative, the loss is more suppressed than that in Comparative Example 2, and when the difference is positive, the loss is increased as compared to that in Comparative Example 2. A representative example of specific numerical values of the differences illustrated in FIGS. 11BA-11BD is described in Table 1.

TABLE 1

| | | Line width of wiring pattern conductor | | | |
|---|---|---|---|---|---|
| | | 70 μm | 50 μm | 40 μm | 30 μm |
| 1 GHz | Working Example 1 - Comparative Example 2 | 0.0000 | 0.0003 | −0.0001 | −0.0003 |
| | Working Example 2 - Comparative Example 2 | −0.0002 | 0.0002 | −0.0001 | −0.0002 |
| 2.76 GHz | Working Example 1 - Comparative Example 2 | 0.0000 | 0.0003 | −0.0004 | −0.0007 |
| | Working Example 2 - Comparative Example 2 | −0.0003 | 0.0004 | −0.0000 | 0.0000 |
| 3.11 GHz | Working Example 1 - Comparative Example 2 | 0.0000 | 0.0004 | −0.0004 | −0.0008 |
| | Working Example 2 - Comparative Example 2 | −0.0003 | 0.0004 | 0.0000 | 0.0001 |
| 32.95 GHz | Working Example 1 - Comparative Example 2 | 0.0021 | 0.0000 | −0.0069 | −0.0153 |
| | Working Example 2 - Comparative Example 2 | −0.0025 | 0.0027 | 0.0066 | 0.0150 |
| 33.13 GHz | Working Example 1 - Comparative Example 2 | 0.0021 | −0.0000 | −0.0069 | −0.0154 |
| | Working Example 2 - Comparative Example 2 | −0.0025 | 0.0027 | 0.0067 | 0.0151 |
| 60 GHz | Working Example 1 - Comparative Example 2 | 0.0065 | −0.0069 | −0.0346 | −0.0794 |
| | Working Example 2 - Comparative Example 2 | −0.0053 | 0.0061 | 0.0279 | 0.0743 |

As is apparent from the results illustrated in FIGS. 11AA-11AD, FIGS. 11BA-11BD, and Table 1, it is understood that the loss relating to the conductor column is influenced by the line widths of the wiring pattern conductors 17b and 15b connected to the conductor column, in addition to the configuration of the conductor column itself.

To be specific, (i) in a case where the line width is substantially equal to the diameter of the large-diameter portion of the via conductor (here, 80 μm), for example, when the line width is 70 μm, the loss is suppressed in Working Example 2. That is, in the case (i), the small-diameter portions 311S and 312S of the via conductors 311 and 312 can be joined to each other as in the conductor column 160b described above, and that the wiring pattern conductors 17b and 15b can be connected to the large-diameter portions 311L and 312L. Here, "substantially equal" includes not only being completely equal but also being approximately equal, and includes, for example, a difference of about 15%, such as 80 μm and 70 μm, as described above.

Further, (ii) in a case where the line width is less than the diameter of the large-diameter portion of the via conductor (here, 80 μm) and larger than the diameter of the small-diameter portion (here, 40 μm), for example, when the line width is 50 μm, the loss is suppressed in a frequency band of 33.13 GHz or more in Working Example 1, and the loss is suppressed in a frequency band of 32.95 or less in Comparative Example 2. That is, in a case where an in-use frequency band is 33.13 GHz or more and also in the case (ii), the large-diameter portions 311L and 312L of the via conductors 311 and 312 can be joined to each other as in the conductor column 16b described above, and that the wiring pattern conductors 17b and 15b can be connected to the small-diameter portions 311S and 312S, respectively.

(iii) In a case where the line width is equal to or less than the diameter of the small-diameter portion of the via conductor (here, 40 μm), for example, when the line width is 40 μm or 30 μm, the loss is suppressed in Working Example 1. That is, in the case (iii), the large-diameter portions 311L and 312L of the via conductors 311 and 312 can be joined to each other as in the conductor column 16b described above, and that the wiring pattern conductors 17b and 15b can be connected to the small-diameter portions 311S and 312S, respectively.

7. Summary on Conductor Columns

Each of the via conductors 311 and 312 has a tapered shape in which a cross section becomes smaller from one end portion toward the other end portion in the Z axis direction, which is the lamination direction of the plurality of insulator layers 411 and 412. Since the large-diameter portions 311L and 312L or the small-diameter portions 311S and 312S of the via conductors 311 and 312 are directly joined to each other, it is possible to reduce a step, formed between the via conductor 311 and the via conductor 312, which causes the loss in the conductor columns 16b and 160b. Therefore, the loss in the conductor columns 16b and 160b may be suppressed.

Specifically, the current flowing through the conductor flows near the surface of the conductor as the frequency is higher, due to the skin effect. Therefore, the signal loss generated when there is a step in the conductor becomes more prominent as the frequency of the signal is higher. As a result, in the conductor column 843 illustrated in FIGS. 9A and 9B, loss is likely to increase due to the step at a joining portion between the two via conductors 312; in particular, the loss is more likely to become large as the frequency of the signal is higher. On the other hand, in the conductor column 16b illustrated in FIGS. 7A and 7B or the conductor column 160b illustrated in FIGS. 8A and 8B, the step at the joining portion between the two via conductors 311 and 312 can be reduced in comparison with the conductor column 843, whereby the loss can be suppressed, and particularly, an excellent effect is exhibited when the frequency is high.

Further, as for the conductor column 16b where the large-diameter portions 311L and 312L of the via conductors 311 and 312 are joined to each other, by making the line width of the wiring pattern conductor 15b (that is, the width of the wiring pattern conductor) smaller than the diameter of the large-diameter portions 311L and 312 L, not only the reduction in loss in the conductor column 16b but also the following effects can be achieved. That is, in a relatively high frequency band of 33.13 GHz or more, loss generated at connection portions between the wiring pattern conductors 15b and 17b and the conductor column 16b can also be suppressed. Because of this, when the frequency band in use is 33.13 GHz or more, loss in the transmission line (in this embodiment, the power supply line) constituted of the conductor column 16b and the wiring pattern conductors 15b and 17b connected to the conductor column 16b can be suppressed.

The line width of the wiring pattern conductors 15b and 17b may be equal to or larger than the diameter of the large-diameter portions 311L and 312L of the conductor column 16b. For example, the line width $W_1$ of the wiring pattern conductor 17b may be equal to or larger than the diameter $D_{1L}$ of the large-diameter portion of the via conductor 311 (that is, $W_1 \geq D_{1L}$).

Further, in the conductor column 16b where the large-diameter portions 311L and 312L of the via conductors 311 and 312 are joined to each other, by making the line width of the wiring pattern conductors 15b and 17b smaller than the diameter of the small-diameter portions 311S and 312S, it is possible to suppress the loss generated at the connection portion between the wiring pattern conductor 15b and the conductor column 16b also in a comparatively low frequency band of less than 33.13 GHz. Accordingly, it is possible to suppress the loss in the transmission line constituted of the conductor column 16b and the wiring pattern conductors 15b and 17b connected to the conductor column 16b regardless of the frequency band in use.

The line width of the wiring pattern conductors 15b and 17b may be larger than the diameter of the small-diameter portions 311S and 312S of the conductor column 16b. For example, the line width $W_1$ of the wiring pattern conductor 17b may be larger than the diameter $D_{1S}$ of the small-diameter portion of the via conductor 311 (that is, $W_1 > D_{1S}$).

Further, in the conductor column 160b where the small-diameter portions 311S and 312S of the via conductors 311 and 312 are joined to each other, by making the line width of the wiring pattern conductors 15b and 17b substantially equal to the diameter of the large-diameter portions 311L and 312L, it is possible to suppress not only the loss in the conductor column 160b but also the loss generated at the connection portions between the wiring pattern conductors 15b and 17b and the conductor column 160b. Accordingly, it is possible to suppress the loss in the transmission line constituted of the conductor column 160b and the wiring pattern conductors 15b and 17b connected to the conductor column 160b.

The line width of the wiring pattern conductors 15b and 17b may be less than the diameter of the large-diameter portions 311L and 312L of the conductor column 160b. For example, the line width $W_1$ of the wiring pattern conductor 17b may be less than the diameter $D_{1L}$ of the large-diameter portion of the via conductor 311 (that is, $W_1 < D_{1L}$).

The conductor columns 16b and 160b constitute a transmission line for transmitting a radio frequency signal. Accordingly, it is possible to suppress a situation in which the radio frequency signal to be transmitted is deteriorated in the dielectric substrate 14; this feature is useful for a communication apparatus or the like required to have high communication quality.

The conductor columns 16b and 160b are not limited to the above-described transmission line, and may be constituted to be a conductor column for grounding or a conductor column for supplying power, for example.

Further, according to the antenna module 1 according to the present embodiment, by including the above-described dielectric substrate 14, loss relating to the conductor columns 16b and 160b is suppressed, so that the communication quality can be improved.

Further, since the RFIC 20 is arranged to overlap with the arrangement region (the region 19) of the plurality of antenna elements 10, the length of the wiring pattern conductors 15b and 17b constituting the power supply line can be shortened, so that the loss in the power supply line can be suppressed. Therefore, the antenna module 1 according to the present embodiment is particularly useful as an antenna module of a millimeter wave band where communication quality is easily affected and deteriorated by the loss in the power supply line.

8. Various Modification Examples of Conductor Columns

The conductor columns 16b and 160b may differ from the above-described configuration due to a positional shift of the dielectric substrate 14 during the manufacture thereof, and influence of various restrictions of the material, the manufacturing process, and the like of the dielectric substrate 14. As such, various modification examples of the conductor columns 16b and 160b described above will be described with reference to FIGS. 12A to 16.

Figure 12A:
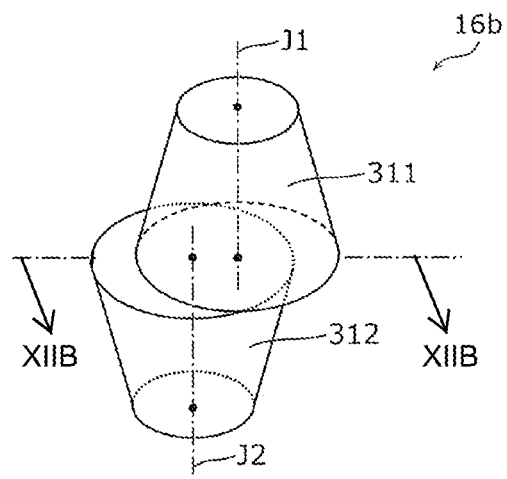
FIG. 12A is a perspective view of a first modification example of the conductor column in the first embodiment.
Figure 12B:
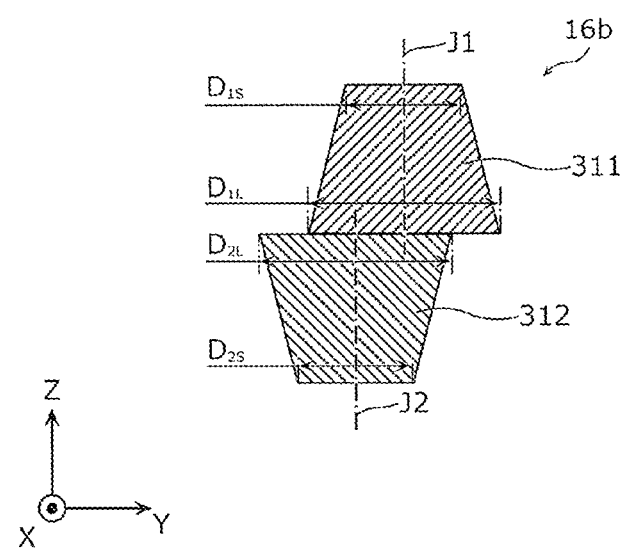
FIG. 12B is a cross-sectional view of the first modification example of the conductor column in the first embodiment.

FIG. 12A is a perspective view of a first modification example of the conductor column 16b in the present embodiment. FIG. 12B is a cross-sectional view of the first modification example. Specifically, in FIG. 12B, a cross section taken along a XIIB-XIIB line illustrated in FIG. 12A is illustrated.

As illustrated in these drawings, a taper axis J1 of the via conductor 311 and a taper axis J2 of the via conductor 312 may be shifted from each other. That is, the situation in which the via conductor 311 and the via conductor 312 are joined to each other includes not only a case where the taper axis J1 coincides with the taper axis J2 but also a case where these axes are shifted from each other.

Note that, however, when the taper axis J1 and the taper axis J2 are shifted from each other, the taper axis J1 can intersect the via conductor 312, and the taper axis J2 can intersect the via conductor 311. That is, when viewed in the lamination direction, the via conductor 311 and the via conductor 312 can be disposed in such a manner that the center of one of them is located inside another one of them and the center of another one of them can be located inside the one of them. By disposing the via conductor 311 and the via conductor 312 as described above, it is possible to further reduce the step generated between the via conductor 311 and the via conductor 312. Therefore, the loss in the conductor column 16b can be further suppressed.

Figure 13A:
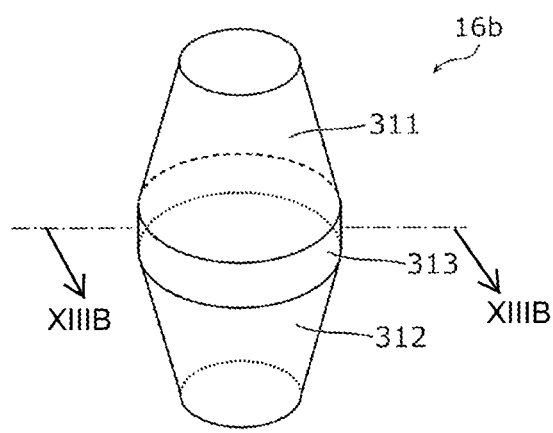
FIG. 13A is a perspective view of a second modification example of the conductor column in the first embodiment.
Figure 13B:
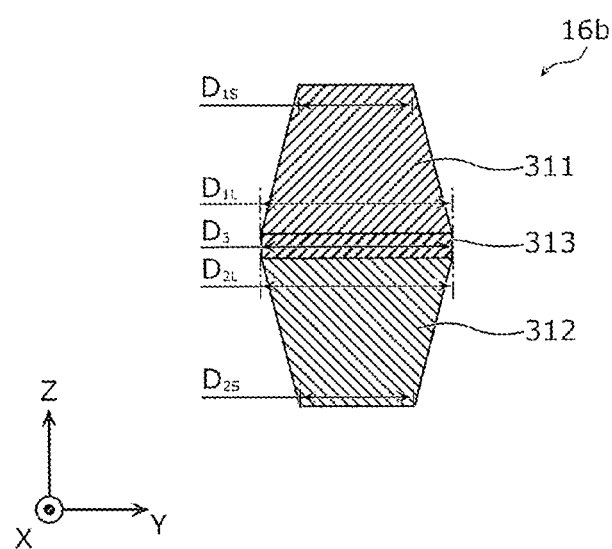
FIG. 13B is a cross-sectional view of the second modification example of the conductor column in the first embodiment.

In the above description, the via conductor 311 as an example of the first via conductor and the via conductor 312 as an example of the second via conductor are directly joined to each other, but the present disclosure is not limited thereto, and they may be joined to each other with an electrode pad or the like interposed therebetween. FIG. 13A is a perspective view of a second modification example of the conductor column 16*b* in the present embodiment. FIG. 13B is a cross-sectional view of the second modification example. Specifically, in FIG. 13B, a cross section taken along a XIIIB-XIIIB line illustrated in FIG. 13A is illustrated.

As illustrated in these drawings, the conductor column 16*b* may include an electrode pad 313 in addition to the via conductor 311 and the via conductor 312. The electrode pad 313 is a pattern electrode disposed between the insulator layer 411 as an example of the first insulator layer (see FIG. 7B) and the insulator layer 412 as an example of the second insulator layer (see FIG. 7B), and one principal surface thereof is joined to the via conductor 311 and another principal surface thereof is joined to the via conductor 312.

In this regard, when viewed in the lamination direction, the electrode pad 313 has a shape disposed at the inside of at least one of the large-diameter portion 311L of the via conductor 311 and the large-diameter portion 312L of the via conductor 312. That is, when viewed in the lamination direction, the electrode pad 313 is disposed at the inside of at least one of the above large-diameter portions by being moved or rotated. Herein, when viewed in the lamination direction, the large-diameter portions 311L and 312L have the same shape and the same size, and the electrode pad 313 is constituted to have the same shape and size as those of the large-diameter portions 311L and 312L. To be specific, when viewed in the lamination direction, the diameter $D_3$ of the electrode pad 313 is equal to the diameter of the large diameter portions 311L and 312L (that is, $D_3=D_{1L}=D_{2L}$).

A shape of the electrode pad 313 is not limited to the shape described above, and may have a shape different from that of the large-diameter portions 311L and 312L, for example, may have a substantially rectangular shape, when viewed in the lamination direction.

Figure 14A:
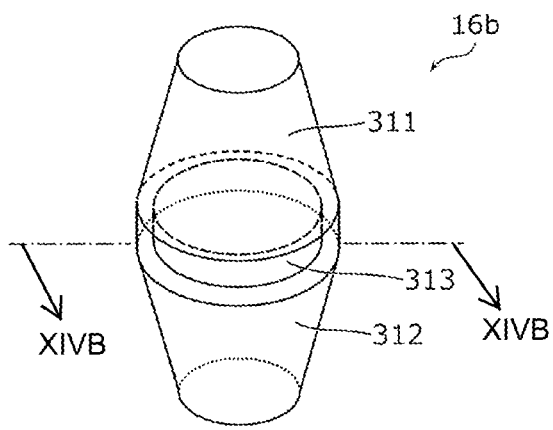
FIG. 14A is a perspective view of a third modification example of the conductor column in the first embodiment.
Figure 14B:
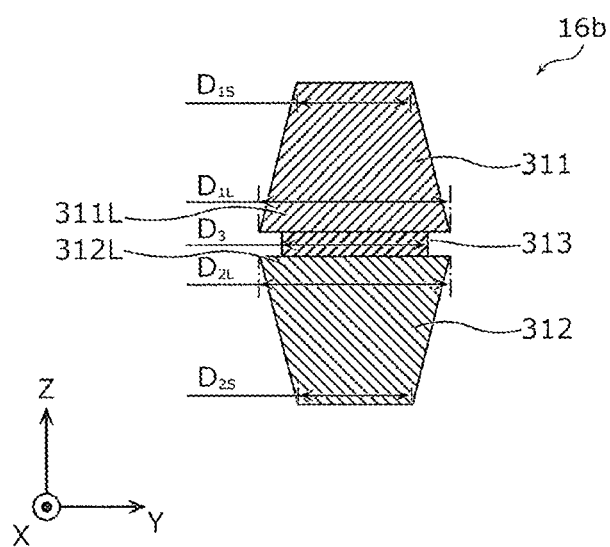
FIG. 14B is a cross-sectional view of the third modification example of the conductor column in the first embodiment.

The diameter $D_3$ of the electrode pad 313 may be less than the diameter of the large-diameter portions 311L and 312L. FIG. 14A is a perspective view of a third modification example of the conductor column 16*b* in the present embodiment. FIG. 14B is a cross-sectional view of the third modification example. Specifically, in FIG. 14B, a cross section taken along a XIVB-XIVB line illustrated in FIG. 14A is illustrated.

As illustrated in these drawings, when viewed in the lamination direction, the large-diameter portions 311L and 312L may have the same shape and the same size, and the electrode pad 313 may be constituted to have the same shape as that of the large-diameter portions 311L and 312L and have a smaller size than that of the large-diameter portions 311L and 312L. However, in a case where the size of the electrode pad 313 is too small, the loss in the conductor column 16*b* may be increased. For this reason, the size of the electrode pad 313 may be appropriately determined in accordance with the requirements specification or the like for the dielectric substrate.

Figure 15A:
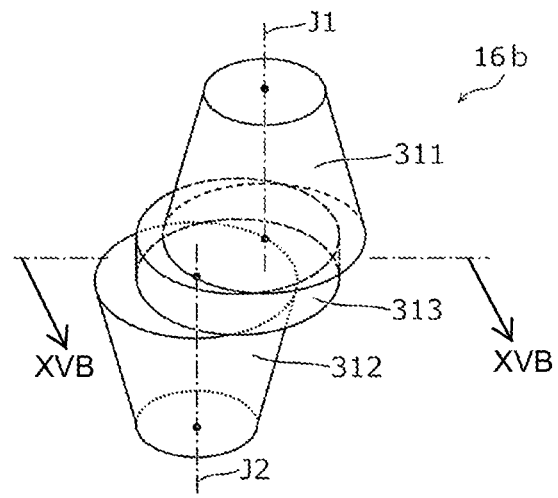
FIG. 15A is a perspective view of a fourth modification example of the conductor column in the first embodiment.
Figure 15B:
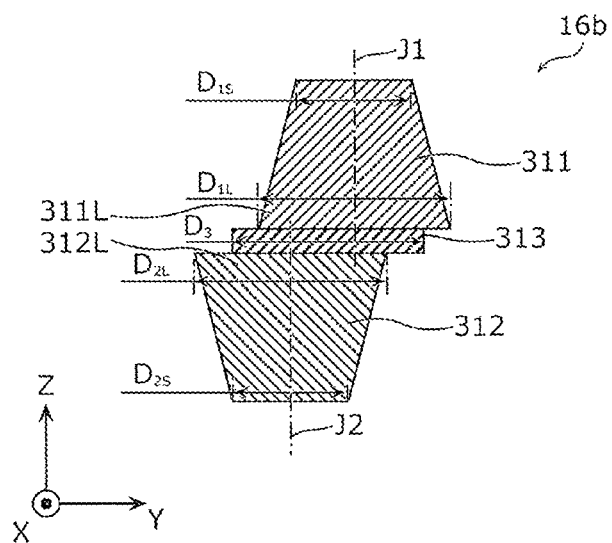
FIG. 15B is a cross-sectional view of the fourth modification example of the conductor column in the first embodiment.

FIG. 15A is a perspective view of a fourth modification example of the conductor column 16*b* in the present embodiment. FIG. 15B is a cross-sectional view of the fourth modification example. Specifically, in FIG. 15B, a cross section taken along a XVB-XVB line illustrated in FIG. 15A is illustrated.

As illustrated in these drawings, the electrode pad 313 may be formed in a shape disposed at the inside of at least one of the large-diameter portion 311L and the large-diameter portion 312L when viewed in the lamination direction, and may be disposed to be shifted from the large-diameter portion 311L and the large-diameter portion 312L.

However, when the electrode pad 313 is disposed in this manner, the electrode pad 313 can intersect with the taper axis J1 of the via conductor 311 and with the taper axis J2 of the via conductor 312 in order to suppress the loss in the conductor column 16*b*. That is, when viewed in the lamination direction, the electrode pad 313 can be disposed to overlap with the center of the via conductor 311 and with the center of the via conductor 312.

Note that the shape and size of the large-diameter portion 311L and the shape and size of the large-diameter portion 312L are not necessarily the same, and may be different from each other.

Thus far, as various modification examples of the present embodiment, the first to fourth modification examples of the conductor column 16*b* have been described in which the large-diameter portions 311L and 312L of the via conductors 311 and 312 are joined to each other. These technical items may also be applied to the conductor column 160*b* in which the small-diameter portions 311S and 312S of the via conductors 311 and 312 are joined to each other.

Figure 16:
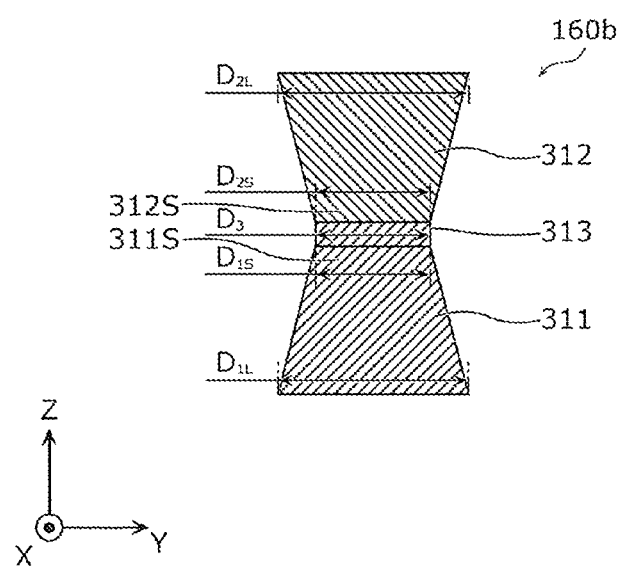
FIG. 16 is a cross-sectional view of a fifth modification example of the conductor column in the first embodiment.

Further, the conductor column 160*b* may be constituted as illustrated in FIG. 16. FIG. 16 is a cross-sectional view of a fifth modification example of the conductor column (a modification example of the conductor column 160*b*) in the present embodiment.

As illustrated in the drawing, when the small-diameter portions 311S and 312S of the via conductors 311 and 312 are joined to each other, the electrode pad 313 can be disposed as follows. To be specific, when viewed in the lamination direction, the electrode pad 313 has a shape disposed at the inside of at least one of the small-diameter portion 311S of the via conductor 311 and the small-diameter portion 312S of the via conductor 312. Since the small-diameter portions 311S and 312S are joined to each other with the electrode pad 313 interposed therebetween, a protruding portion which causes loss at a portion where the small-diameter portions 311S and 312S are joined to each other is unlikely to be formed. Because of this, the loss can be further suppressed in the conductor column 160*b* where the small-diameter portions 311S and 312S of the via conductors 311 and 312 are joined to each other with the electrode pad 313 interposed therebetween.

Note that in the conductor column 160*b*, the configuration of the electrode pad 313 is not limited to the configuration described above. In other words, when viewed in the lamination direction, the electrode pad 313 may be formed in a shape disposed at the inside of at least one of the large-diameter portions 311L and 312L, and may also have a shape larger than any one of the small-diameter portions 311S and 312S.

Not limited to the conductor columns 16*b* and 160*b*, other conductor columns may also have configurations similar to those of the conductor columns 16*b* and 160*b*.

9. Effects

As described above, the number of antenna elements 10 constituting the antenna element group including the first antenna element (for example, any one of the antenna elements 10*e* to 10*h*) located on the center O side of the region 19 is made to be smaller than the number of antenna elements 10 constituting the antenna element group 11b including the second antenna element (for example, any one of the antenna elements 10i to 10l) located on the end portion side of the region 19. With this, the power supplied to the antenna element group 11b including the second antenna element located on the end portion side of the region 19 becomes smaller than the power supplied to the antenna element group including the first antenna element located on the center O side of the region 19, thereby making it possible to suppress side lobes in the first direction. Moreover, since the number of antenna elements 10 connected to each of the power supply terminals 21a to 21f included in the RFIC 20 does not need to be uniform, the number of antenna elements 10 and the interval between the antenna elements 10 can be flexibly designed.

Further, the number of antenna elements 10 constituting the antenna element group including the third antenna element (for example, any one of the antenna elements 10e to 10h) located on the center O side of the region 19 is made to be smaller than the number of antenna elements 10 constituting the antenna element group 11a including the fourth antenna element (for example, any one of the antenna element 10a to 10d) located on the end portion side of the region 19. As a result, the power supplied to the antenna element group 11a including the fourth antenna element located on the end portion side of the region 19 becomes smaller than the power supplied to the antenna element group including the third antenna element located on the center O side of the region 19, so that the side lobes in the second direction perpendicular to the first direction can also be suppressed. That is, the side lobes on both sides (the positive X axis side and the negative X axis side) can be suppressed with respect to the center O of the region 19 (for example, the center of the dielectric substrate 14).

Further, the path connecting one power supply terminal and the antenna elements constituting the antenna element group including the second antenna element is a branched path like the wiring pattern conductor 17b, for example, in order to connect the one power supply terminal and the plurality of antenna elements connected to each other. This causes the path to have a complicated structure and the wiring length may become long, so that the wiring loss is increased. On the other hand, each of the via conductors 311 and 312 has a tapered shape in which a cross section becomes smaller from one end portion toward the other end portion in the Z axis direction, which is the lamination direction of the plurality of insulator layers 411 and 412. Since the large-diameter portions or the small-diameter portions of the via conductors 311 and 312 are directly joined to each other, it is possible to reduce a step, formed between the via conductor 311 and the via conductor 312, which causes the loss in the conductor columns 16b and 160b. Therefore, the loss in the conductor columns 16b and 160b can be suppressed, that is, the loss in the path can be suppressed.

Each of the via conductors 311 and 312 has a tapered shape in which a cross section becomes smaller from one end portion toward the other end portion in the lamination direction of the plurality of insulator layers 411 and 412, and the via conductor 311 and the via conductor 312 are joined in such a manner that each large-diameter portion which is an end portion with a larger cross section or each small-diameter portion which is an end portion with a smaller cross section is joined to each other with the electrode pad 313 interposed between the large-diameter portions or the small-diameter portions. Since the large-diameter portions or the small-diameter portions of the via conductors 311 and 312 are joined to each other with the electrode pad 313 interposed therebetween, it is possible to reduce a step, formed between the via conductor 311 and the via conductor 312, which causes the loss in the conductor columns 16b and 160b. Therefore, the loss in the conductor columns 16b and 160b can be suppressed, that is, the loss in the path can be suppressed.

Second Embodiment

Next, as an antenna module 2 according to a second embodiment, an antenna module including 36 antenna elements 10l to 136, which are disposed on a dielectric substrate 140 and orthogonally arranged in two dimensions of six rows and six columns along the X axis direction and the Y axis direction, will be described below.

Figure 17:
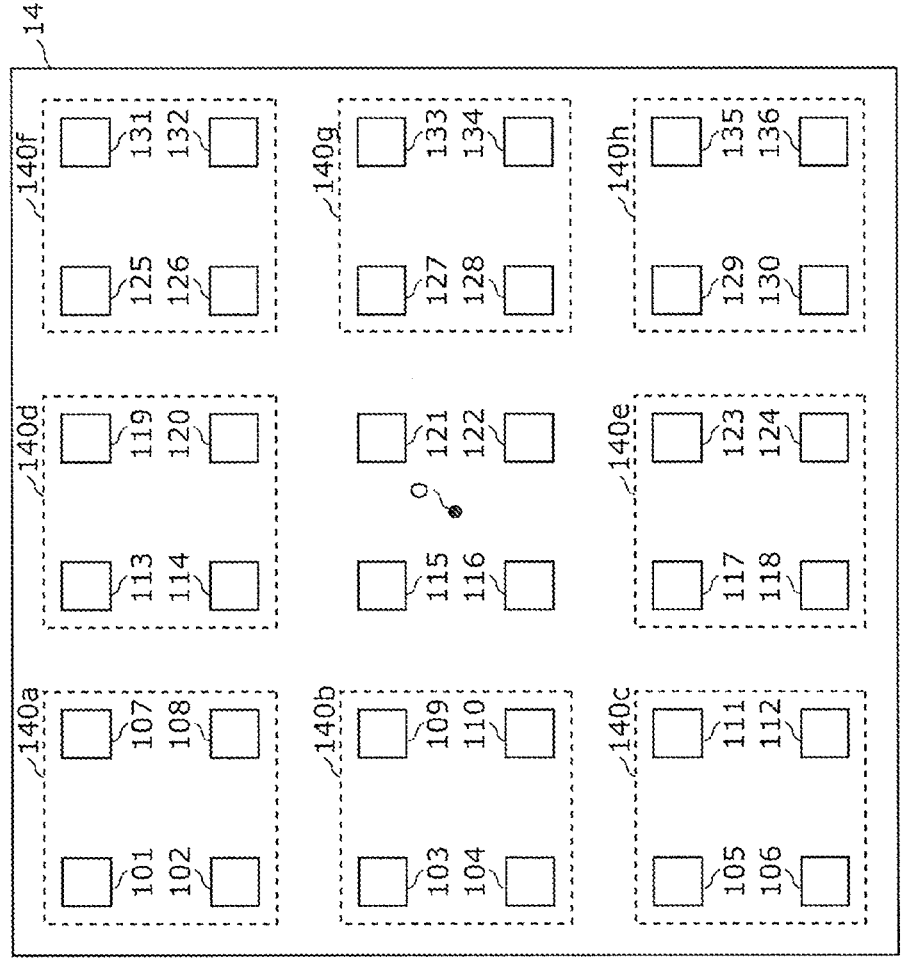
FIG. 17 is a plan view of an antenna module according to a second embodiment.

FIG. 17 is a plan view of the antenna module 2 according to the second embodiment. Although the antenna module 2 includes an RFIC provided on the dielectric substrate 140 and having a plurality of power supply terminals for supplying power to the plurality of antenna elements 10l to 136, the RFIC is not illustrated in FIG. 17 because it is disposed on a side opposite to one principal surface of the dielectric substrate 140 where the antenna elements 10l to 136 are provided.

The antenna elements 10l, 102, 107, and 108 are connected to one another to constitute an antenna element group 140a as a group of four antenna elements of two rows and two columns. Similarly, groups of four antenna elements of two rows and two columns are connected to one another to constitute antenna element groups 140b to 140h. Although any one of the antenna elements 115, 116, 121, and 122 is not connected to other antenna elements, each of the antenna elements 115, 116, 121, and 122 constituted of a single antenna element is also defined as an antenna element group, as described in the first embodiment.

The antenna element groups 140a to 140h and the antenna elements 115, 116, 121 and 122 are not connected to other antenna element groups, and the plurality of antenna element groups are not electrically connected to one another. The plurality of power supply terminals provided in the RFIC that is included in the antenna module 2 are respectively connected to different antenna element groups. That is, the RFIC of the second embodiment includes at least 12 power supply terminals connected to the antenna element groups 140a to 140h, and the antenna elements 115, 116, 121, and 122.

The plurality of antenna elements 10l to 136 include a first antenna element and a second antenna element disposed along a first direction connecting two points within a region containing all the plurality of antenna elements 10l to 136 in a plan view of the dielectric substrate 140. Although not illustrated in FIG. 17, the region is a minimum region encompassing the plurality of antenna elements 10l to 136 in the plan view of the dielectric substrate 140, and is a region having a substantially rectangular shape in the present embodiment.

The first antenna element is located on the side of a center O relative to the second antenna element. For example, when the first direction is set to be the X axis direction, the first antenna element is any one of the antenna elements 121 and 122, and the second antenna element is any one of the antenna elements 127, 128, 133, and 134. For example, the first antenna element is set to be the antenna element 121, and the second antenna element is set to be the antenna element 127, which is located on an end portion side of the region along the first direction relative to the antenna element 121.

The total number of antenna elements constituting the antenna element group including the antenna element 121 is one, while the total number of antenna elements constituting the antenna element group 140g including the antenna element 127 is four. In other words, the total number of antenna elements (one) to which power is supplied by the power supply line for supplying power to the antenna element 121 is smaller than the total number of antenna elements (four) to which power is supplied by the power supply line for supplying power to the antenna element 127. In this manner, the total number of antenna elements to which power is supplied by the power supply line for supplying power to the first antenna element is smaller than the total number of antenna elements to which power is supplied by the power supply line for supplying power to the second antenna element, and the total number of antenna elements constituting the antenna element group including the first antenna element is smaller than the total number of antenna elements constituting the antenna element group including the second antenna element.

The plurality of antenna elements 10l to 136 include a third antenna element and a fourth antenna element disposed along the first direction. In this case, the first antenna element, the second antenna element, the third antenna element, and the fourth antenna element are arranged in the order of the fourth antenna element, the third antenna element, the center O, the first antenna element, and the second antenna element.

For example, the third antenna element is any one of the antenna elements 115 and 116, and the fourth antenna element is any one of the antenna elements 103, 104, 109, and 110. For example, the third antenna element is set to be the antenna element 116, and the fourth antenna element is set to be the antenna element 110, which is located on an end portion side of the region along the first direction relative to the antenna element 116.

The total number of antenna elements constituting the antenna element group including the antenna element 116 is one, while the total number of antenna elements constituting the antenna element group 140b including the antenna element 110 is four. In other words, the total number of antenna elements (one) to which power is supplied by the power supply line for supplying power to the antenna element 116 is smaller than the total number of antenna elements (four) to which power is supplied by the power supply line for supplying power to the antenna element 110. In this manner, the total number of antenna elements to which power is supplied by the power supply line for supplying power to the third antenna element is smaller than the total number of antenna elements to which power is supplied by the power supply line for supplying power to the fourth antenna element, and the total number of antenna elements constituting the antenna element group including the third antenna element is smaller than the total number of antenna elements constituting the antenna element group including the fourth antenna element.

The plurality of antenna elements 10l to 136 include a fifth antenna element and a sixth antenna elements disposed along a second direction perpendicular to the first direction in the plan view of the dielectric substrate 140.

The fifth antenna element is located on the center O side relative to the sixth antenna element. For example, when the second direction is set to be the Y axis direction, the fifth antenna element is any one of the antenna elements 115 and 121, and the sixth antenna element is any one of the antenna elements 113, 114, 119, and 120. For example, the fifth antenna element is set to be the antenna element 115, and the sixth antenna element is set to be the antenna element 114, which is located on an end portion side of the region along the second direction relative to the antenna element 115.

The total number of antenna elements constituting the antenna element group including the antenna element 115 is one, while the total number of antenna elements constituting the antenna element group 140d including the antenna element 114 is four. In other words, the total number of antenna elements (one) to which power is supplied by the power supply line for supplying power to the antenna element 115 is smaller than the total number of antenna elements (four) to which power is supplied by the power supply line for supplying power to the antenna element 114. In this manner, the total number of antenna elements to which power is supplied by the power supply line for supplying power to the fifth antenna element is smaller than the total number of antenna elements to which power is supplied by the power supply line for supplying power to the sixth antenna element, and the total number of antenna elements constituting the antenna element group including the fifth antenna element is smaller than the total number of antenna elements constituting the antenna element group including the sixth antenna element.

The plurality of antenna elements 10l to 136 include a seventh antenna element and an eighth antenna element disposed along the second direction. In this case, the fifth antenna element, the sixth antenna element, the seventh antenna element, and the eighth antenna element are arranged in the order of the eighth antenna element, the seventh antenna element, the center O, the fifth antenna element, and the sixth antenna element.

For example, the seventh antenna element is any one of the antenna elements 116 and 122, and the eighth antenna element is any one of the antenna elements 117, 118, 123, and 124. For example, the seventh antenna element is set to be the antenna element 122, and the eighth antenna element is set to be the antenna element 123, which is located on the end portion side of the region along the second direction relative to the antenna element 122.

The total number of antenna elements constituting the antenna element group including the antenna element 122 is one, while the total number of antenna elements constituting the antenna element group 140e including the antenna element 123 is four. In other words, the total number of antenna elements (one) to which power is supplied by the power supply line for supplying power to the antenna element 122 is smaller than the total number of antenna elements (four) to which power is supplied by the power supply line for supplying power to the antenna element 123. In this manner, the total number of antenna elements to which power is supplied by the power supply line for supplying power to the seventh antenna element is smaller than the total number of antenna elements to which power is supplied by the power supply line for supplying power to the eighth antenna element, and the total number of antenna elements constituting the antenna element group including the seventh antenna element is smaller than the total number of antenna elements constituting the antenna element group including the eighth antenna element.

Note that the first antenna element, the third antenna element, the fifth antenna element, and the seventh antenna element may include the same antenna element. For example, these antenna elements may be the same antenna element, which is any one of the antenna elements 115, 116, 121, and 122.

With the above configuration, in the antenna element groups 140a to 140h, power is supplied to four antenna elements from a single power supply terminal. On the other hand, each of the antenna elements 115, 116, 121, and 122 is supplied with power from a single power supply terminal. Therefore, the power supplied to the antenna elements constituting the antenna element groups 140a to 140h is smaller than the power supplied to the antenna elements 115, 116, 121, and 122.

As described above, the total number of antenna elements to which power is supplied by the power supply line for supplying power to the first antenna element (for example, any one of the antenna elements 121 and 122) located on the center O side of the region containing all the plurality of antenna elements 10l to 136 in the plan view of the dielectric substrate 140 is made to be smaller than the total number of antenna elements to which power is supplied by the power supply line for supplying power to the second antenna element (for example, any one of the antenna elements 127, 128, 133, and 134) located on the end portion side of the region. With this, the power supplied to the antenna element group 140g including the second antenna element located on the end portion side of the region becomes smaller than the power supplied to the antenna element group including the first antenna element located on the center O side of the region, thereby making it possible to suppress side lobes in the first direction.

Furthermore, the total number of antenna elements to which power is supplied by the power supply line for supplying power to the third antenna element (for example, any one of the antenna elements 115 and 116) located on the center O side of the region is made to be smaller than the total number of antenna elements to which power is supplied by the power supply line for supplying power to the fourth antenna element (for example, any one of the antenna elements 103, 104, 109, and 110) located on the end portion side of the region. With this, the power supplied to the antenna element group 140b including the fourth antenna element located on the end portion side of the region becomes smaller than the power supplied to the antenna element group including the third antenna element located on the center O side of the region, thereby making it possible to more effectively suppress the side lobes in the first direction. To be specific, the side lobes on both sides (the positive X axis side and the negative X axis side) can be suppressed with respect to the center of the region (for example, the center of the dielectric substrate 140).

Power distribution supplied to the plurality of antenna elements arranged two-dimensionally is not limited to one dimension, and may be two-dimensional. That is, the total number of antenna elements to which power is supplied by the power supply line for supplying power to the fifth antenna element (for example, any one of the antenna elements 115 and 121) located on the center O side of the region is made to be smaller than the total number of antenna elements to which power is supplied by the power supply line for supplying power to the sixth antenna element (for example, any one of the antenna elements 113, 114, 119, and 120) located on the end portion side of the region. As a result, the power supplied to the antenna element group 140d including the sixth antenna element located on the end portion side of the region becomes smaller than the power supplied to the antenna element group including the fifth antenna element located on the center O side of the region, so that side lobes in the second direction perpendicular to the first direction can also be suppressed.

Furthermore, the total number of antenna elements to which power is supplied by the power supply line for supplying power to the seventh antenna element (for example, any one of the antenna elements 116 and 122) located on the center O side of the region is made to be smaller than the total number of antenna elements to which power is supplied by the power supply line for supplying power to the eighth antenna element (for example, any one of the antenna elements 117, 118, 123, and 124) located on the end portion side of the region. With this, the power supplied to the antenna element group 140e including the eighth antenna element located on the end portion side of the region becomes smaller than the power supplied to the antenna element group including the seventh antenna element located on the center O side of the region, thereby making it possible to more effectively suppress the side lobes in the second direction. To be specific, for example, it is possible to suppress the side lobes in four directions toward upper, lower, right, and left sides (the positive and negative X axis sides, and the positive and negative Y axis sides) in a plan view with respect to the center O of the region (for example, the center of the dielectric substrate 140).

The first direction may be a direction obtained when the X axis direction is rotated by 45 degrees toward the positive Y axis side about the Z axis as a central axis, and the second direction may be a direction obtained when the X axis direction is rotated by 45 degrees toward the negative Y axis side about the Z axis as the central axis. In this case, the first antenna element is the antenna element 121, the second antenna element is any one of the antenna elements 125, 126, 131 and 132, and the power supplied to the antenna element group 140f including the second antenna element becomes smaller than the power supplied to the antenna element group including the first antenna element. The third antenna element is the antenna element 116, the fourth antenna element is any one of the antenna elements 105, 106, 111 and 112, and the power supplied to the antenna element group 140c including the fourth antenna element becomes smaller than the power supplied to the antenna element group including the third antenna element. Further, the fifth antenna element is the antenna element 115, the sixth antenna element is any one of the antenna elements 10l, 102, 107 and 108, and the power supplied to the antenna element group 140a including the sixth antenna element becomes smaller than the power supplied to the antenna element group including the fifth antenna element. The seventh antenna element is the antenna element 122, the eighth antenna element is any one of the antenna elements 129, 130, 135 and 136, and the power supplied to the antenna element group 140h including the eighth antenna element becomes smaller than the power supplied to the antenna element group including the seventh antenna element.

As described above, in the antenna module 2 according to the second embodiment, the side lobes in all directions can be suppressed with respect to the center of the dielectric substrate 140.

Third Embodiment

Next, as an antenna module 3 according to a third embodiment, the antenna module 3 including 192 antenna elements, which are disposed on a dielectric substrate 150 and orthogonally arranged in two dimensions of 16 rows and 12 columns along the X axis direction and the Y axis direction, will be described below.

Figure 18:
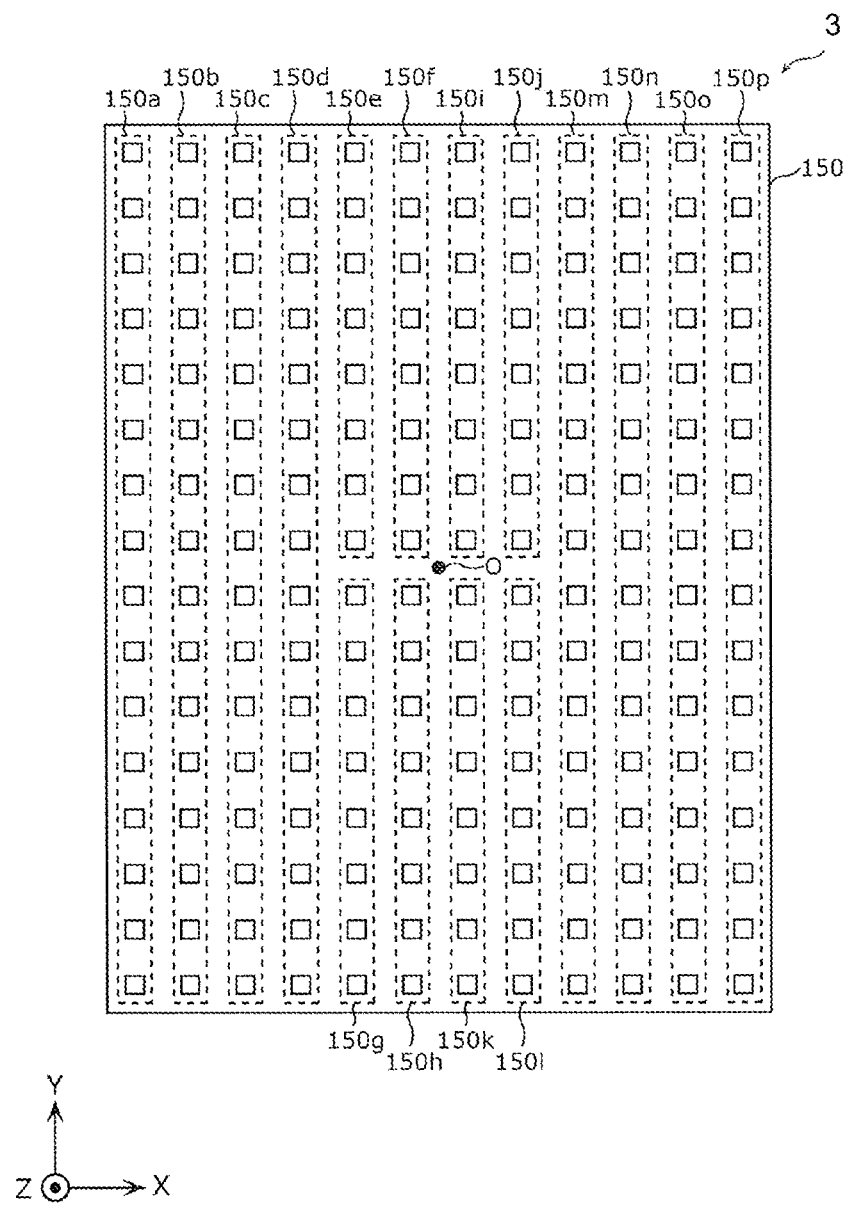
FIG. 18 is a plan view of an antenna module according to a third embodiment.

FIG. 18 is a plan view of the antenna module 3 according to the third embodiment. Although the antenna module 3 includes an RFIC 200 disposed on the dielectric substrate 150 and having a plurality of power supply terminals 220A to 220P for supplying power to the plurality of antenna elements, the RFIC 200 is not illustrated in FIG. 18 because it is disposed on a side opposite to one principal surface of the dielectric substrate 150 where the plurality of antenna elements are disposed. The RFIC 200 will be described in detail with reference to FIG. 19 to be described later.

The plurality of antenna elements provided in the antenna module 3 include a plurality of antenna element groups, each constituted of one antenna element or two or more antenna elements connected to each other. The plurality of antenna element groups are disposed along a first direction (for example, the X axis direction). Specifically, the plurality of antenna element groups are a plurality of antenna element groups 150a to 150p in column form, in each of which a plurality of antenna elements connected to each other are arranged along a direction perpendicular to the first direction (for example, the Y axis direction) in a plan view of the dielectric substrate 150.

The plurality of antenna element groups 150a to 150p in the column form are not connected to other antenna element groups, and the plurality of antenna element group 150a to 150p in the column form are not electrically connected to one another. The plurality of power supply terminals 220A to 220P included in the RFIC 200 provided in the antenna module 3 are respectively connected to different antenna element groups in the column form. That is, the RFIC 200 of the third embodiment includes at least 16 power supply terminals 220A to 220P to be connected to the plurality of antenna element groups 150a to 150P in the column form.

Each of the antenna element groups 150a to 150d and 150m to 150p in the column form is constituted of 16 antenna elements connected to one another, each of the antenna element groups 150e to 150l in the column form is constituted of eight antenna elements connected to one another, and the plurality of antenna element groups 150a to 150p in the column form are disposed along the first direction. Note that the first antenna element described in the second embodiment is any one of the antenna elements constituting the antenna element groups 150i to 150l in the column form, the second antenna element is any one of the antenna elements constituting the antenna element groups 150m to 150p in the column form, the third antenna element is any one of the antenna elements constituting the antenna element groups 150e to 150h in the column form, and the fourth antenna element is any one of the antenna elements constituting the antenna element groups 150a to 150d in the column form.

In this case, among the plurality of antenna element groups 150a to 150p, the total number of antenna elements constituting each of the plurality of antenna element groups 150i to 150p in the column form disposed on the end portion side of the region (for example, the right side of FIG. 18) relative to the center O of the region containing all the plurality of antenna elements is equal to or larger than the total number of antenna elements constituting the antenna element group in the column form disposed closer to the center O side than itself, or is equal to or smaller than the total number of antenna elements constituting the antenna element group in the column form disposed closer to the end portion side than itself. Although not illustrated in FIG. 18, the region is a minimum region encompassing the plurality of antenna elements in the plan view of the dielectric substrate 150, and is a region having a substantially rectangular shape in the present embodiment.

For example, the total number (16) of antenna elements constituting the antenna element group 150m in the column form is larger than the total number (8) of antenna elements constituting the antenna element group 150j in the column form disposed on the center O side relative to the antenna element group 150m in the column form, and is equal to the total number (16) of antenna elements constituting the antenna element group 150n disposed on the end portion side of the region. For example, the total number (8) of antenna elements constituting the antenna element group 150i in the column form is equal to the total number (8) of antenna elements constituting the antenna element group 150j in the column form disposed on the end portion side of the region relative to the antenna element group 150i in the column form. For example, the total number (16) of antenna elements constituting the antenna element group 150p in the column form is equal to the total number (16) of antenna elements constituting the antenna element group 150o in the column form disposed on the center O side relative to the antenna element group 150p in the column form.

As described above, the total number of antenna elements constituting each of the plurality of antenna element groups 150i to 150p in the column form disposed along the first direction is kept equal or becomes larger as coming close toward the end portion of the region containing all the plurality of antenna elements along the first direction. Accordingly, since the total number of antenna elements constituting the antenna element group for each column does not decrease but increases from the center O of the region toward the end portion thereof, it is possible to more effectively suppress the side lobes in the first direction. Similarly, the total number of antenna elements constituting each of the plurality of antenna element groups 150a to 150h in the column form disposed on the end portion side of the region (for example, the left side of FIG. 18) relative to the center O of the region containing all the plurality of antenna elements is kept equal or becomes larger as coming close toward the end portion side of the region containing all the plurality of antenna elements along the first direction. Therefore, the side lobes in the first direction can be more effectively suppressed.

Among the plurality of antenna element groups 150a to 150p in the column form, the antenna element groups located on the center O side (for example, the antenna element groups 150e to 150l, and the like in the column form) may include an antenna element group constituted of one antenna element.

Fourth Embodiment

The antenna modules described in the above embodiments can be applied to communication apparatuses. Hereinafter, a communication apparatus 6 to which the antenna module 3 of the third embodiment is applied will be described.

Figure 19:
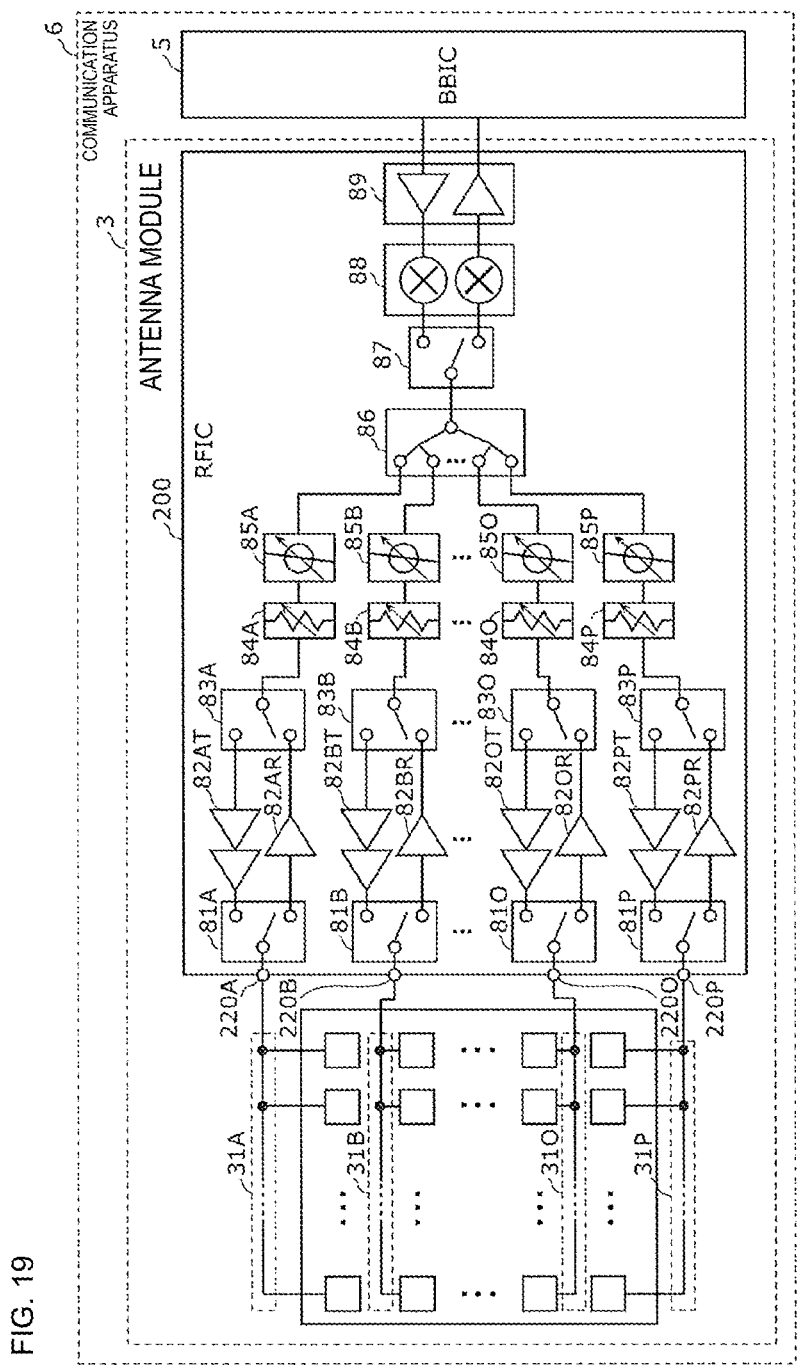
FIG. 19 is a circuit diagram of a communication apparatus according to a fourth embodiment.

FIG. 19 is a circuit diagram of the communication apparatus 6 according to a fourth embodiment. The communication apparatus 6 illustrated in FIG. 19 includes the antenna module 3 and a baseband signal processing circuit (BBIC) 5. The communication apparatus 6 up-converts a signal transmitted from the baseband signal processing circuit 5 to the antenna module 3 to a radio frequency signal so as to radiate it from a plurality of antenna elements (array antenna), and down-converts a radio frequency signal received by the array antenna to perform signal processing thereupon in the baseband signal processing circuit 5.

The RFIC 200 includes switches 81A to 81P, 83A to 83P, and 87, power amplifiers 82AT to 82PT, low noise amplifiers 82AR to 82PR, attenuators 84A to 84P, phase shifters 85A to 85P, a signal synthesizer/demultiplexer 86, a mixer 88, and an amplification circuit 89.

The switches 81A to 81P and 83A to 83P are switch circuits configured to switch the transmission and the reception in each signal path.

The signal transmitted from the baseband signal processing circuit 5 is amplified by the amplification circuit 89, and up-converted by the mixer 88. The up-converted radio frequency signal is demultiplexed into 16 waves by the signal synthesizer/demultiplexer 86 to be supplied respectively to different antenna element groups while passing through 16 transmission paths. At this time, the directivity of the array antenna can be adjusted by individually adjusting the degrees of phase-shifting of the phase shifters 85A to 85P disposed in each of signal paths.

The radio frequency signals received by the antenna elements respectively pass through 16 different reception paths to be combined by the signal synthesizer/demultiplexer 86; the combined signal is down-converted by the mixer 88, amplified by the amplification circuit 89, and transmitted to the baseband signal processing circuit 5.

The RFIC 200 is formed as, for example, a one-chip integrated circuit component including the circuit configuration described above.

The RFIC 200 may not include any one of the switches 81A to 81P, 83A to 83P, and 87, the power amplifiers 82AT to 82PT, the low noise amplifiers 82AR to 82PR, the attenuators 84A to 84P, the phase shifters 85A to 85P, the signal synthesizer/demultiplexer 86, the mixer 88, and the amplification circuit 89. Further, the RFIC 200 may include only one of the transmission path and the reception path. The antenna module 3 according to the present embodiment is applied to a system configured to transmit/receive radio frequency signals of not only a single frequency band but also a plurality of frequency bands (multiband).

The antenna module 3 includes branch circuits 31A to 31P, and the branch circuits 31A to 31P are constituted of, for example, wiring pattern conductors. The branch circuits 31A to 31P may be constituted by using electronic components or the like.

Other Embodiments

Although the antenna modules according to the embodiments of the present disclosure have been described thus far while citing the above-described embodiments, the present disclosure is not limited to the above embodiments. Other embodiments achieved by combining any one of the constituent elements of the above embodiments as well as modifications obtained by carrying out modifications, conceived by those skilled in the art, on the above embodiments without necessarily departing from the spirit and scope of the present disclosure are also included in the present disclosure.

For example, in the first and second embodiments, the antenna element groups including the first antenna element, the third antenna element, the fifth antenna element, and the seventh antenna element are each constituted of one antenna element, but may be constituted of two or more antenna elements connected to each other.

Further, for example, the plurality of antenna elements are disposed on one principal surface of the dielectric substrate, but may be disposed inside the dielectric substrate. The RFIC is disposed on another principal surface of the dielectric substrate, but may be disposed inside the dielectric substrate.

The first direction is not limited to the X axis direction or the like described in the above embodiments, and may be any direction as long as it is a direction connecting two points within a region containing all the plurality of antenna elements in a plan view of the dielectric substrate. That is, it is sufficient for the antenna module of the present disclosure to include the first antenna element and the second element disposed along any direction connecting two points within the region.

The number of radio frequency circuit elements included in the antenna module is not limited to one, and a plurality of radio frequency circuit elements may be included therein. The dielectric substrate included in the antenna module may be constituted of a plurality of dielectric substrates arranged in tiled form. In other words, the antenna module may be constituted of a plurality of dielectric substrates each including a radio frequency circuit element. In the antenna module including the plurality of dielectric substrates described above, it is sufficient that the power supplied to the antenna elements in a central portion of the entirety of the plurality of dielectric substrates becomes larger. Therefore, in each dielectric substrate, the power supplied to the antenna element in a central portion of the dielectric substrate is not necessarily larger than the power supplied to the antenna element on the end portion side thereof.

In addition to supplying power to a plurality of antenna elements included in one antenna element group in an equally distributed manner, weighted power distribution may be carried out to achieve a smoother power distribution.

The mode of a conductor column constituted of via conductors having a tapered shape can be applied not only to a conductor column constituted of two via conductors but also to a conductor column constituted of three or more via conductors.

Further, for example, the antenna modules according to the above embodiments may also be applied to Massive MIMO systems. One of the promising radio transmission technologies in the fifth generation mobile communication system (5G) is a combination of a phantom cell and a Massive MIMO system. The phantom cell is a network configuration configured to separate a control signal for securing communication stability between a macro cell in a low frequency band and a small cell in a high frequency band, and a data signal to be subjected to high-speed data communication. Each phantom cell is provided with an antenna device of Massive MIMO. The Massive MIMO system is technology for improving transmission quality in a millimeter wave band or the like, and controls the directivity of the antenna by controlling a signal transmitted from each antenna element 10. Since the Massive MIMO system uses a large number of antenna elements 10, it is possible to generate a beam having sharp directivity. By enhancing the directivity of the beam, the radio wave can be emitted over a long distance to some degree even in a high frequency band, and the interference between the cells can be reduced to improve the frequency utilization efficiency.

INDUSTRIAL APPLICABILITY

The present disclosure is widely applicable to communication apparatuses such as a millimeter wave band mobile communication system, a Massive MIMO system and the like, as an antenna module able to suppress side lobes.

REFERENCE SIGNS LIST 1, 1a, 2, 3 ANTENNA MODULE
5 BASEBAND SIGNAL PROCESSING CIRCUIT (BBIC)
6 COMMUNICATION APPARATUS
10, 10a to 10l, 10l to 136 ANTENNA ELEMENT
11a, 11b, 12a to 12f, 140a to 140h, 150a to 150p ANTENNA ELEMENT GROUP
14, 140, 150 DIELECTRIC SUBSTRATE
14a UPPER LAYER
14b MIDDLE LAYER
14c LOWER LAYER
15a to 15f, 17a, 17b WIRING PATTERN CONDUCTOR
16a to 16f, 18a to 18l, 143g, 160b, 843 CONDUCTOR COLUMN
19 REGION
20, 200 RADIO FREQUENCY CIRCUIT ELEMENT (RFIC)
21a to 21f, 220A to 220P POWER SUPPLY TERMINAL
31A to 31P BRANCH CIRCUIT
81A to 81P SWITCH
82AR to 82PR LOW NOISE AMPLIFIER
82AT to 82PT POWER AMPLIFIER
84A to 84P ATTENUATOR
85A to 85P PHASE SHIFTER
86 SIGNAL SYNTHESIZER/DEMULTIPLEXER
88 MIXER
89 AMPLIFICATION CIRCUIT
141 SUBSTRATE BASE BODY
144, 144a, 144b, 144c GROUND CONDUCTOR
144x OPENING
311, 312 VIA CONDUCTOR
311S, 312S SMALL-DIAMETER PORTION
311L, 312L LARGE-DIAMETER PORTION
313 ELECTRODE PAD
411, 412 INSULATOR LAYER

The invention claimed is:

1. An antenna module comprising:
a dielectric substrate;
a plurality of antenna elements disposed on a same layer of the dielectric substrate and two-dimensionally arranged; and
a radio frequency circuit element disposed on the dielectric substrate and including a plurality of power supply terminals configured to supply power to each of the plurality of antenna elements via power supply lines,
wherein the plurality of antenna elements include a first antenna element and a second antenna element disposed along a first direction connecting two points within a region containing all the plurality of antenna elements in a plan view of the dielectric substrate,
the first antenna element is located on a center portion of the region, and
a total number of antenna elements to which power is supplied by a first power supply line that supplies power to the first antenna element is smaller than a total number of antenna elements to which power is supplied by a second power supply line that supplies power to the second antenna element.

2. The antenna module according to claim 1,
wherein the plurality of antenna elements include a plurality of antenna element groups each constituted of one antenna element or two or more antenna elements connected to each other,
the plurality of antenna element groups are not electrically connected to one another,
the plurality of power supply terminals are respectively connected to different antenna element groups, and
a number of antenna elements constituting the antenna element group including the first antenna element is smaller than a number of antenna elements constituting the antenna element group including the second antenna element.

3. The antenna module according to claim 2,
wherein the plurality of antenna element groups are disposed along the first direction, and
a total number of antenna elements constituting each of the antenna element groups disposed on an end portion of the region among the plurality of antenna element groups is equal to or larger than a total number of antenna elements constituting the antenna element group disposed on the center portion.

4. The antenna module according to claim 3,
wherein the plurality of antenna element groups include a plurality of antenna element groups in column, in each of which the plurality of antenna elements connected to one another are arranged along a direction perpendicular to the first direction in the plan view, and
a total number of antenna elements constituting each of the antenna element groups in the column disposed on the end portion among the plurality of antenna element groups is equal to or larger than a total number of antenna elements constituting the antenna element group in the column disposed on the center portion.

5. The antenna module according to claim 1,
wherein the plurality of antenna elements include a third antenna element and a fourth antenna element disposed along the first direction,
the first antenna element, the second antenna element, the third antenna element, and the fourth antenna element are aligned in an order of the fourth antenna element, the third antenna element, a center of the region, the first antenna element, and the second antenna element, and
a total number of antenna elements to which power is supplied by the first power supply line that supplies power to the third antenna element is smaller than a total number of antenna elements to which power is supplied by the second power supply line that supplies power to the fourth antenna element.

6. The antenna module according to claim 1,
wherein the plurality of antenna elements include a fifth antenna element and a sixth antenna element disposed along a second direction perpendicular to the first direction in the plan view,
the fifth antenna element is located closer to a center of the region than the sixth antenna element is, and
a total number of antenna elements to which power is supplied by the first power supply line that supplies power to the fifth antenna element is smaller than a total number of antenna elements to which power is supplied by the second power supply line for supplying power to the sixth antenna element.

7. The antenna module according to claim 6,
wherein the plurality of antenna elements include a seventh antenna element and an eighth antenna element disposed along the second direction, the fifth antenna element, the sixth antenna element, the seventh antenna element, and the eighth antenna element are aligned in the order of the eighth antenna element, the seventh antenna element, the center of the region, the fifth antenna element, and the sixth antenna element, and a total number of antenna elements to which power is supplied by the first power supply line that supplies power to the seventh antenna element is smaller than a total number of antenna elements to which power is supplied by the second power supply line that supplies power to the eighth antenna element.

8. The antenna module according to claim 1, wherein the plurality of antenna elements are disposed on one principal surface of the dielectric substrate, the radio frequency circuit element is disposed on another principal surface of the dielectric substrate, the dielectric substrate includes a plurality of insulator layers being laminated and a conductor column passing through two or more insulator layers among the plurality of insulator layers, the conductor column includes a first via conductor passing through a first insulator layer and a second via conductor passing through a second insulator layer adjacent to the first insulator layer, each of the first via conductor and the second via conductor has a tapered shape in which a cross section becomes smaller from one end portion toward another end portion in a lamination direction of the plurality of insulator layers, the first via conductor and the second via conductor are joined in such a manner that each large-diameter portion which is an end portion with a larger cross section or each small-diameter portion which is an end portion with a smaller cross section is directly joined to each other, and the conductor column is disposed in a path connecting the antenna elements constituting the antenna element group including the second antenna element and one of the plurality of power supply terminals included in the radio frequency circuit element.

9. The antenna module according to claim 1, wherein the plurality of antenna elements are disposed on one principal surface of the dielectric substrate, the radio frequency circuit element is disposed on another principal surface of the dielectric substrate, the dielectric substrate includes a plurality of insulator layers being laminated and a conductor column passing through two or more insulator layers among the plurality of insulator layers, the conductor column includes a first via conductor passing through a first insulator layer, a second via conductor passing through a second insulator layer adjacent to the first insulator layer, and an electrode pad which is disposed between the first insulator layer and the second insulator layer, and one principal surface of which is joined to the first via conductor and another principal surface of which is joined to the second via conductor, each of the first via conductor and the second via conductor has a tapered shape in which a cross section becomes smaller from one end portion toward the other end portion in a lamination direction of the plurality of insulator layers, the first via conductor and the second via conductor are joined in such a manner that each large-diameter portion which is an end portion with a larger cross section or each small-diameter portion which is an end portion with a smaller cross section is joined to each other with the electrode pad interposed between the large-diameter portions or the small-diameter portions, the electrode pad has a shape disposed at an inside of at least one of the large-diameter portion of the first via conductor and the larger-diameter portion of the second via conductor when viewed in the lamination direction, and the conductor column is disposed in a path connecting the antenna elements constituting the antenna element group including the second antenna element and one of the plurality of power supply terminals included in the radio frequency circuit element.

10. The antenna module according to claim 1, wherein the radio frequency circuit element includes a phase-shift circuit configured to shift a phase of a radio frequency signal, an amplification circuit configured to amplify the phase-shifted radio frequency signal, and a switch element configured to switch whether or not to supply the amplified radio frequency signal to the antenna element.

11. The antenna module according to claim 2, wherein the plurality of antenna elements include a third antenna element and a fourth antenna element disposed along the first direction, the first antenna element, the second antenna element, the third antenna element, and the fourth antenna element are aligned in an order of the fourth antenna element, the third antenna element, a center of the region, the first antenna element, and the second antenna element, and a total number of antenna elements to which power is supplied by the first power supply line that supplies power to the third antenna element is smaller than a total number of antenna elements to which power is supplied by the second power supply line that supplies power to the fourth antenna element.

12. The antenna module according to claim 3, wherein the plurality of antenna elements include a third antenna element and a fourth antenna element disposed along the first direction, the first antenna element, the second antenna element, the third antenna element, and the fourth antenna element are aligned in an order of the fourth antenna element, the third antenna element, a center of the region, the first antenna element, and the second antenna element, and a total number of antenna elements to which power is supplied by the first power supply line that supplies power to the third antenna element is smaller than a total number of antenna elements to which power is supplied by the second power supply line that supplies power to the fourth antenna element.

13. The antenna module according to claim 4, wherein the plurality of antenna elements include a third antenna element and a fourth antenna element disposed along the first direction, the first antenna element, the second antenna element, the third antenna element, and the fourth antenna element are aligned in an order of the fourth antenna element, the third antenna element, a center of the region, the first antenna element, and the second antenna element, and a total number of antenna elements to which power is supplied by the first power supply line that supplies power to the third antenna element is smaller than a total number of antenna elements to which power is supplied by the second power supply line that supplies power to the fourth antenna element.

14. The antenna module according to claim 2, wherein the plurality of antenna elements include a fifth antenna element and a sixth antenna element disposed along a second direction perpendicular to the first direction in the plan view, the fifth antenna element is located closer to a center of the region than the sixth antenna element is, and a total number of antenna elements to which power is supplied by the first power supply line that supplies power to the fifth antenna element is smaller than a total number of antenna elements to which power is supplied by the second power supply line that supplies power to the sixth antenna element.

15. The antenna module according to claim 3, wherein the plurality of antenna elements include a fifth antenna element and a sixth antenna element disposed along a second direction perpendicular to the first direction in the plan view, the fifth antenna element is located closer to a center of the region than the sixth antenna element is, and a total number of antenna elements to which power is supplied by the first power supply line that supplies power to the fifth antenna element is smaller than a total number of antenna elements to which power is supplied by the second power supply line that supplies power to the sixth antenna element.

16. The antenna module according to claim 4, wherein the plurality of antenna elements include a fifth antenna element and a sixth antenna element disposed along a second direction perpendicular to the first direction in the plan view, the fifth antenna element is located closer to a center of the region than the sixth antenna element is, and a total number of antenna elements to which power is supplied by the first power supply line that supplies power to the fifth antenna element is smaller than a total number of antenna elements to which power is supplied by the second power supply line that supplies power to the sixth antenna element.

17. The antenna module according to claim 5, wherein the plurality of antenna elements include a fifth antenna element and a sixth antenna element disposed along a second direction perpendicular to the first direction in the plan view, the fifth antenna element is located closer to a center of the region than the sixth antenna element is, and a total number of antenna elements to which power is supplied by the first power supply line that supplies power to the fifth antenna element is smaller than a total number of antenna elements to which power is supplied by the second power supply line that supplies power to the sixth antenna element.

18. The antenna module according to claim 2, wherein the plurality of antenna elements are disposed on one principal surface of the dielectric substrate, the radio frequency circuit element is disposed on another principal surface of the dielectric substrate, the dielectric substrate includes a plurality of insulator layers being laminated and a conductor column passing through two or more insulator layers among the plurality of insulator layers, the conductor column includes a first via conductor passing through a first insulator layer and a second via conductor passing through a second insulator layer adjacent to the first insulator layer, each of the first via conductor and the second via conductor has a tapered shape in which a cross section becomes smaller from one end portion toward another end portion in a lamination direction of the plurality of insulator layers, the first via conductor and the second via conductor are joined in such a manner that each large-diameter portion which is an end portion with a larger cross section or each small-diameter portion which is an end portion with a smaller cross section is directly joined to each other, and the conductor column is disposed in a path connecting the antenna elements constituting the antenna element group including the second antenna element and one of the plurality of power supply terminals included in the radio frequency circuit element.

19. The antenna module according to claim 3, wherein the plurality of antenna elements are disposed on one principal surface of the dielectric substrate, the radio frequency circuit element is disposed on another principal surface of the dielectric substrate, the dielectric substrate includes a plurality of insulator layers being laminated and a conductor column passing through two or more insulator layers among the plurality of insulator layers, the conductor column includes a first via conductor passing through a first insulator layer and a second via conductor passing through a second insulator layer adjacent to the first insulator layer, each of the first via conductor and the second via conductor has a tapered shape in which a cross section becomes smaller from one end portion toward another end portion in a lamination direction of the plurality of insulator layers, the first via conductor and the second via conductor are joined in such a manner that each large-diameter portion which is an end portion with a larger cross section or each small-diameter portion which is an end portion with a smaller cross section is directly joined to each other, and the conductor column is disposed in a path connecting the antenna elements constituting the antenna element group including the second antenna element and one of the plurality of power supply terminals included in the radio frequency circuit element.

20. The antenna module according to claim 4, wherein the plurality of antenna elements are disposed on one principal surface of the dielectric substrate, the radio frequency circuit element is disposed on another principal surface of the dielectric substrate, the dielectric substrate includes a plurality of insulator layers being laminated and a conductor column passing through two or more insulator layers among the plurality of insulator layers, the conductor column includes a first via conductor passing through a first insulator layer and a second via conductor passing through a second insulator layer adjacent to the first insulator layer, each of the first via conductor and the second via conductor has a tapered shape in which a cross section becomes smaller from one end portion toward another end portion in a lamination direction of the plurality of insulator layers, the first via conductor and the second via conductor are joined in such a manner that each large-diameter portion which is an end portion with a larger cross section or each small-diameter portion which is an end portion with a smaller cross section is directly joined to each other, and the conductor column is disposed in a path connecting the antenna elements constituting the antenna element group including the second antenna element and one of the plurality of power supply terminals included in the radio frequency circuit element.

* * * * *